United States Patent
Nakayama et al.

(10) Patent No.: US 6,359,472 B2
(45) Date of Patent: Mar. 19, 2002

(54) SEMICONDUCTOR INTEGRATED CIRCUIT AND ITS FABRICATION METHOD

(75) Inventors: Michiaki Nakayama, Ome; Masato Hamamoto, Iruma; Kazutaka Mori, Kodaira; Satoru Isomura, Hamura, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/791,831

(22) Filed: Feb. 26, 2001

Related U.S. Application Data

(62) Division of application No. 09/077,829, filed as application No. PCT/JP96/03469 on Nov. 27, 1996.

(30) Foreign Application Priority Data

Dec. 4, 1995 (JP) .............................. 7-315459

(51) Int. Cl.⁷ .............................................. H01L 27/04
(52) U.S. Cl. ........................... 326/121; 326/31; 326/83; 327/534
(58) Field of Search ............................ 326/31, 33, 34, 326/83, 86, 121; 327/534, 535

(56) References Cited

U.S. PATENT DOCUMENTS

| | | | |
|---|---|---|---|
| 5,557,231 A | 9/1996 | Yamaguchi et al. | 327/534 |
| 5,610,533 A | 3/1997 | Arimoto et al. | 326/33 |
| 5,793,691 A | 8/1998 | Mullarkey | 326/33 |

FOREIGN PATENT DOCUMENTS

| | | |
|---|---|---|
| JP | 63-90847 | 4/1988 |
| JP | 06-85200 | 3/1994 |
| JP | 06-120439 | 4/1994 |
| JP | 6-334010 | 12/1994 |
| JP | 7-235608 | 9/1995 |
| JP | 8-17183 | 1/1996 |

OTHER PUBLICATIONS

W. Maly, "Chapter 5: CMOS Technolollgy," Zusetsu Cho Eruesuai Kogaku (*Illustrated ULSI Engineering* in English, pp. 167–191 (in Japanese with English translation).

T. Kuroda, et al., "Low Power Communication Signal Processing," IEEE International Solid–State Circuits Conference, Paper Nos. FA 10.2 and FA 10.3, pp. 166, 167 and 437, (1996).

T. Kuroda, et al., "A High–Speed Low Power 0.3μm CMOS Gate Array with Variable Threshold Voltage (VT) scheme," IEEE Custom Integrated Circuits Conference, pp. 53–56 (1996).

*Primary Examiner*—Michael Tokar
*Assistant Examiner*—Don Phu Le
(74) *Attorney, Agent, or Firm*—Antonelli, Terry, Stout & Kraus, LLP

(57) ABSTRACT

An integrated circuit having a CMOS circuit constituted by electrically connecting an n-type well 2, in which p-channel transistor Tp of the CMOS circuit is set, with a supply line Vdd through switching transistor Tps, and electrically connecting a p-type well 3, in which n-channel transistor Tn of the CMOS circuit is set, with supply line Vss through switching transistor Tns. Thermal runaway due to leakage current can be controlled by turning off switching transistors Tps and Tns and supplying potentials suitable for a test to the n-type well 2 and the p-type well 3 from an external unit when the integrated circuit is being tested. Fluctuations of the latch-up phenomenon and operation speed can be prevented by turning on switching transistors Tps and Tns and setting the n-type well 2 and the p-type well 3 to the voltages Vdd and Vss, respectively.

53 Claims, 22 Drawing Sheets

|  | NORMAL STATE | AGING LEAK CURRENT TEST |
|---|---|---|
| $V_{wl}$ | $V_{dd}$ | $V_{dd} + \Delta V_{BB}$ |
| $V_{su}$ | $V_{ss}$ | $V_{ss} - \Delta V_{BB}$ |
| $C_{wl}$ | $V_{ss}$ | $V_{wl}(V_{dd} + \Delta V_{BB})$ |
| $C_{su}$ | $V_{dd}$ | $V_{su}(V_{ss} - \Delta V_{BB})$ |

SEMICONDUCTOR INTEGRATED CIRCUIT AND ITS FABRICATION METHOD

This is a division of U.S. Ser. No. 09/077,829, filed Jun. 4, 1998, which is a 371 of International Application PCT/JP96/03469, filed on Nov. 27, 1996; and the disclosures of which are incorporated herein by reference.

TECHNICAL FIELD

The present invention relates to a semiconductor integrated circuit and its method of fabrication, particularly to a technique effectively applied to a semiconductor integrated circuit having a CMIS (Complementary Metal Insulator Semiconductor) for preventing thermal runaway during testing, as well as latch-up and fluctuation of the operation speed due to fluctuation of substrate potentials.

BACKGROUND OF THE INVENTION

In recent years, various studies have been made of semiconductor integrated circuits in an effort to attain high integration, greater speed, and low power consumption. Particularly, in the case of a semiconductor integrated circuit having a MOS FET (Metal Oxide Semiconductor Field Effect Transistor) device, it has been necessary to further refine the sizes of devices and wirings in order to improve the degree of device integration and the operation speed and, therefore, the reduction in size of such semiconductor integrated circuits has progressed rapidly.

The present inventor has studied the scaling of a semiconductor integrated circuit. That is, scaling of a semiconductor integrated circuit, such as an LSI (Large Scale Integrated circuit) includes two types of scaling—constant-voltage scaling and constant-electric-field scaling. In the case of a CMOS semiconductor integrated circuit including a CMOS FET as a component, constant-electric-field scaling is mainly employed for the purpose of securing the reliability of a gate oxide film. In this case, it is also necessary to lower the power supply voltage proportionally to effect reduction of the device size from the viewpoint of securing the stability of the device operating characteristic.

The literature on the fabrication of a CMOS semiconductor integrated circuit includes, for example, W. MALY "ZUSETSU CHO ERUESUAl KOGAKU (transliterated)", pp. 167–191, issued by KEIGAKU SHUPPAN (transliterated) Co., Ltd. on Dec. 15, 1990. An original text of the above-transliterated publication is "Atlas of IC Technologies: An Introduction to VLSI Processes" by W. Maly (Copyright© 1987 by The Benjamin/Cummings Publishing Company Inc.).

In the case of the above-disclosed CMOS semiconductor integrated circuit, to make a scaling rule practically effective, it is necessary to lower the threshold voltage in proportion to the device size. This is because a voltage component contributing to the circuit operation can be represented by the expression "power supply voltage—threshold voltage". However, because lowering of the threshold voltage causes an increase in leakage current, a leakage current test (I ddq test) widely used for testing a semiconductor integrated circuit cannot be performed, and, moreover, in the case of an aging test, the temperature is excessively raised due to an increase in the leakage current and, thereby, a problem of thermal runaway occurs.

FIG. 29 illustrates the mechanism of thermal runaway in the case of an aging test. In FIG. 29, the x-axis shows the set junction temperature (junction temperature Tj1) of a semiconductor integrated circuit and the y-axis shows the temperature (junction temperature Tj2) obtained by adding a temperature rise due to the total leakage current of a semiconductor integrated circuit produced due to the junction temperature Tj1 increasing relative to the ambient temperature. Normally, the junction temperature Tj2 and the junction temperature Tj1 are stabilized at an equal temperature. However, when a leakage current component increases, the temperature is excessively raised due to the leakage current and, resultingly, thermal runaway occurs.

By applying a back bias to the well of a MOS FET in order to solve the above problem, it is possible to control the threshold voltage. In the case of this technique, however, the well potential may fluctuate due to noise under practical use (under normal operation) and a problem may occur in which a forward current is applied between the well and the source/drain to produce a so-called latch-up phenomenon.

One way of decreasing the leakage current by using a back bias is described in, for example, the official gazette of Japanese Patent Laid-Open No. 6-334010/1994, which discloses a structure in which the substrate node of a low-threshold-voltage field effect transistor, constituting a group of logic circuits, is connected to a power supply line, and a dummy power supply line, connected to the group of logic circuits, is connected to a power supply line through a high-threshold-voltage field effect transistor. In the case of this arrangement, the field effect transistor, whose substrate node is connected to the power supply line, can perform a normal operation at a low threshold voltage by turning on the high-threshold-voltage transistor under normal operation of the semiconductor integrated circuit, while the low-threshold-voltage field effect transistor can temporarily have a high threshold voltage by turning off the high-threshold-voltage field effect transistor and applying a test voltage to the dummy power supply line. However, this circuit has a problem in that the circuit impedance increases and, thereby, the general operation speed of the semiconductor integrated circuit lowers because the high-threshold-voltage field effect transistor is connected in series between the group of logic circuits and the power supply.

Moreover, the official gazette of Japanese Patent Laid-Open No. 8-17183/1996 discloses a way of using switching means for making the substrate potential of a MOS FET variable as a means for controlling the threshold voltage of the MOS FET. This arrangement makes it possible to switch the switching characteristic and the sub-threshold current characteristic because the switching means switches the back gate bias of the MOS FET to a first potential or second potential and the absolute values of the threshold voltage of the MOS FET. In the case of this proposal, however, the source and n-well of a p-channel MOS FET are short-circuited each to the other through an n-channel MOS FET. Therefore, problems occur in that (1) it is necessary to generate a voltage higher than the power supply voltage under normal operation, and (2) the device characteristics are deteriorated because the high voltage in the above Item (1) is applied to the MOS FET and, thereby, the thickness of the gate oxide film of the MOS FET must be increased.

SUMMARY OF THE INVENTION

It is an object of the present invention to provide a high-performance CMOS semiconductor integrated circuit which is capable of preventing the latch-up phenomenon, and its fabrication method.

Moreover, it is another object of the present invention to provide a way of preventing the latch-up phenomenon of a CMOS semiconductor integrated circuit from occurring under normal operation of the semiconductor integrated circuit and of preventing a leakage current from being generated during a test of the circuit.

Furthermore, it is still another object of the present invention to provide a way of improving the reliability of a CMOS semiconductor integrated circuit under normal operation and under test, without lowering the operation speed of the semiconductor integrated circuit under normal operation of the circuit. Furthermore, it is still another object of the present invention to provide a way of improving the reliability of a CMOS semiconductor integrated circuit under the normal operation and test of the circuit without deteriorating the device characteristics.

The above and other objects and novel features of the present invention will become more apparent from the following description when taken in conjunction with the accompanying drawings.

That is, a semiconductor integrated circuit of the present invention has a first power-supply-voltage line connected to a CMOS FET and a second power-supply-voltage line to which a voltage lower than that of the first power-supply-voltage line is applied, and moreover has a third power-supply-voltage line and a fourth power-supply-voltage line, independent of the first and the second power-supply-voltage lines, which makes it possible to supply power to a first-conductivity-type well through the third power-supply-voltage line according to necessity and a second-conductivity-type well through the fourth power-supply-voltage line according to necessity.

Moreover, in the case of a semiconductor integrated circuit of the present invention, a first switching transistor comprising a MOS FET is connected between a first power-supply-voltage line and a third power-supply-voltage line, and a second switching transistor comprising a MOS FET is connected between a second power-supply-voltage line and a fourth power-supply-voltage line, which makes it possible to short-circuit the first power-supply-voltage line and the third power-supply-voltage line by operating the first switching transistor according to necessity, and to short-circuit the second power-supply-voltage line and the fourth power-supply-voltage line by operating the second switching transistor according to necessity.

Thereby, under the normal operation of a semiconductor integrated circuit, for example, it is possible to control the fluctuation of substrate potentials of the first- and second-conductivity-type MOS FETs by turning on first- and second-switching transistors and supplying the first and second power-supply voltages to the first- and second-conductivity-type wells. Therefore, it is possible to prevent the latch-up phenomenon due to fluctuation of substrate potentials.

Moreover, during the test of a semiconductor integrated circuit, for example, it is possible to decrease the leakage current by turning off the first and second switching transistors and applying a voltage suitable for the test to the first- and second-conductivity type wells from the third and fourth power-supply-voltage lines. Therefore, it is possible to control thermal runaway due to a leakage current.

Furthermore, a semiconductor integrated circuit fabrication method of the present invention comprises the steps of:

forming first- and second-conductivity-type wells on the surface of a semiconductor substrate;

forming a second-conductivity-type MOS FET for constituting a CMOS FET and a first switching transistor having a MOS FET different from the second-conductivity-type MOS FET in the first-conductivity-type well;

forming a first-conductivity-type MOS FET for constituting a CMOS FET and a second switching transistor having a MOS FET different from the first-conductivity-type MOS FET;

forming a first power-supply-voltage line so as to be connected with the source of the second-conductivity-type MOS FET for constituting the CMOS FET;

forming a second power-supply-voltage line so as to be connected with the source of the first-conductivity-type MOS FET for constituting the CMOS FET;

forming a well feeding line so as to be connected with the source of the first switching transistor and the first-conductivity-type well;

forming a well feeding line so as to be connected with the source of the second switching transistor and the second-conductivity-type well;

forming a control signal line so as to be connected with the gate electrode of the—first switching transistor; and forming a control signal line so as to be connected with the gate electrode of the second switching transistor; wherein the first switching transistor is set adjacent to the source of the second-conductivity-type MOS FET in the same semiconductor region and the second switching transistor is set adjacent to the source of the first-conductivity-type MOS FET in the same semiconductor region.

Thereby, it is possible to decrease the areas occupied by the first and the second switching transistors and thus, it is possible to improve the efficiency of layout.

Furthermore, a semiconductor integrated circuit fabrication method of the present invention comprises the steps of:

forming a first-conductivity-type well and a second-conductivity-type well on the surface of a semiconductor substrate;

forming a second-conductivity-type MOS FET for constituting a CMOS FET in the first-conductivity-type well and a first switching transistor having a MOS FET different from the second-conductivity-type MOS FET;

forming a first-conductivity-type MOS FET for constituting a CMOS FET in the second-conductivity-type well and a second switching transistor having a MOS FET different from the first-conductivity-type MOS FET;

forming a first power-supply-voltage line so as to be connected with the source of the second-conductivity-type MOS FET for constituting the CMOS FET;

forming a second power-supply-voltage line so as to be connected with the source of the first-conductivity-type MOS FET for constituting the CMOS FET;

forming a well feeding line so as to be connected with the source of the first switching transistor and the first-conductivity-type well;

forming a well feeding line so as to be connected with the source of the second switching transistor and the second-conductivity-type well;

forming a control signal line so as to be connected with the gate electrode of the first switching transistor; and forming a control signal line so as to be connected with the gate electrode of the second switching transistor; wherein the step of forming the well feeding line so as to be connected with the source of the first switching transistor and the first-conductivity-type well and the step of forming the well feeding line so-as to be connected with the source of the second switching transistor and the second-conductivity-type well are performed in the same step, and the step of forming the control signal line so as to be connected with the gate electrode of the first switching transistor and the step of forming the control signal line so as to be connected with the gate electrode of the second switching transistor are performed in the same step.

Thereby, by forming a first switching transistor, its well feeding line and its control signal line, and a second switching transistor, its well feeding line and its control signal line, in the same step, it is possible to fabricate a semiconductor integrated circuit having a first switching transistor, a second switching transistor, well feeding lines, and control signal lines.

Moreover, a semiconductor integrated circuit of the present invention is fabricated by providing a set of the first and second switching transistors for a plurality of logic gates, respectively. Thereby, it is possible to decrease the entire switching-transistor occupied area compared to the case of providing a first switching transistor and a second switching transistor for each logic gate. Therefore, it is possible to prevent the chip size from increasing due to addition of switching transistors and to prevent the device integration degree from decreasing.

Furthermore, a semiconductor integrated circuit of the present invention is fabricated by constituting the third power-supply-voltage line and the fourth power-supply-voltage line with a conductor wiring, providing a connecting portion for connecting a conductor wiring for the third power-supply-voltage line with the first-conductivity-type well, and providing a connecting portion for connecting a conductor wiring for the fourth power-supply-voltage line with the second-conductivity-type well for each cell region to which each of the logic gates is set. Thereby, because a well feeding voltage can be supplied from the vicinity of each logic gate, it is possible to stably supply a potential to each logic gate.

Moreover, a semiconductor integrated circuit of the present invention is fabricated by providing a switching control section for dividing a control signal in a control signal line into two control signals having a potential different from each other and transmitting each divided control signal to each of the first and the second switching transistors for the front stages of inputs of the first and the second switching transistors. Thereby, it is possible to turn on/off the switching transistors using one control signal line.

Furthermore, a semiconductor integrated circuit of the present invention is fabricated by providing the first switching transistor and the second switching transistor in an available space in which power-supply-voltage lines are arranged. In this way, it is possible to effectively use available space in the principal plane of a semiconductor chip and prevent the area of the chip from increasing, compared to the case of providing switching transistors in an area other than the wiring arranging area.

In this specification any reference to a MOS FET or MOS FETs shall be considered to be inclusive of IGFETs (Insulated-Gate Field-Effect Transistors) or MISFETs (Metal-Insulated-Semiconductor Field Effect Transistors), in general.

BEST MODE FOR CARRYING OUT THE INVENTION

The present invention will be described herein in detail with reference to the accompanying drawings. In all drawings for explaining the various embodiments, components having the same function are provided with the same symbol and a repetitive explanation thereof will be omitted.

Figure 1:
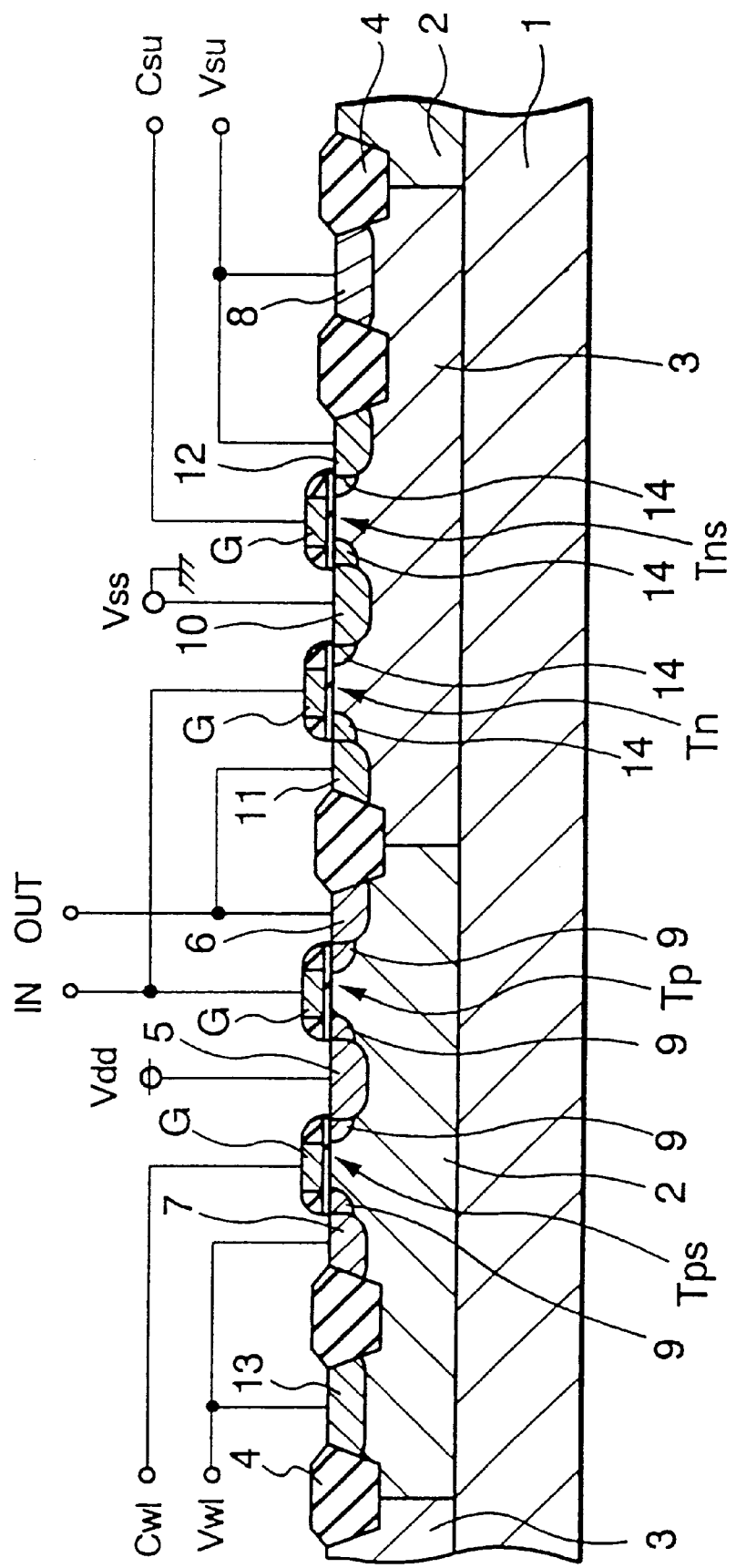
FIG. 1 is a schematic sectional view showing a CMOS semiconductor integrated circuit representing an embodiment of the present invention.
Figure 2:
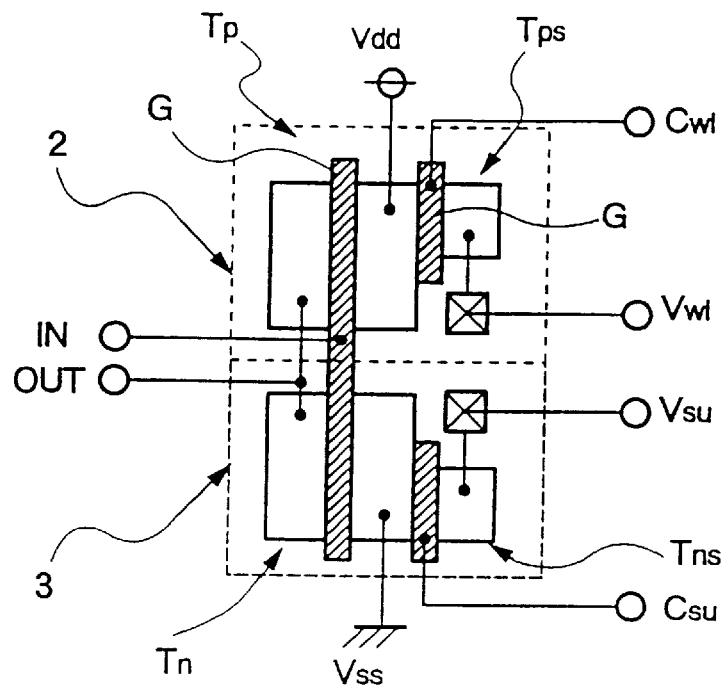
FIG. 2 is a schematic layout diagram showing a CMOS semiconductor integrated circuit representing an embodiment of the present invention.
Figure 3:
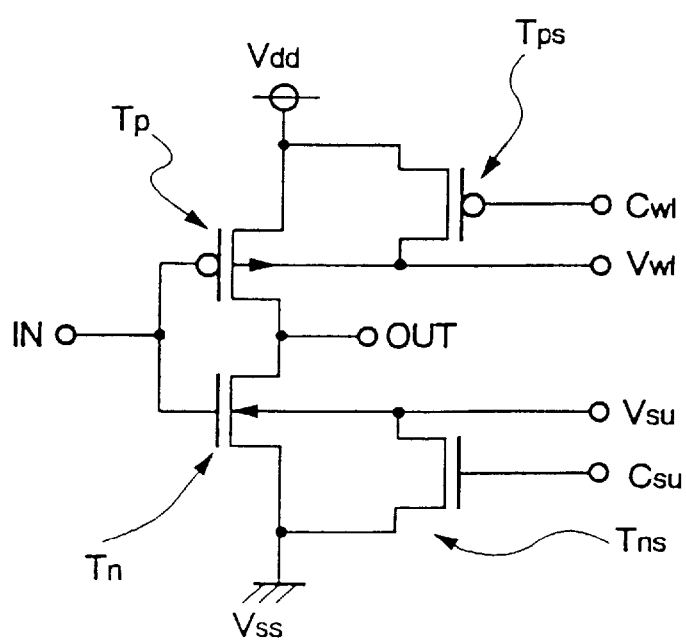
FIG. 3 is a schematic circuit diagram showing a CMOS semiconductor integrated circuit representing an embodiment of the present invention.

The CMOS semiconductor integrated circuit of a first embodiment will be specifically described while referring to FIGS. 1 to 5. FIGS. 1 to 3 show the region of an inverter used for the logic gate of a CMOS semiconductor integrated circuit.

Moreover, in this specification, a symbol such as Vdd is used to represent a voltage as a general indication, as well as to represent a wiring to which the voltage is applied. Moreover, in FIGS. 1 to 3, a circular mark denotes an electrode, such as a pin, provided for an end of each wiring, and a square provided with hatching x denotes a contact region connecting different wiring layers, that is, the region of a through-hole conductive layer embedded in a through-hole. Also, in the schematic sectional view of FIG. 1, showing the CMOS semiconductor integrated circuit of this embodiment, various sectional regions in the schematic layout diagram of the CMOS semiconductor integrated circuit of FIG. 2 are connected in order to make the illustration and description clear.

In the case of the CMOS semiconductor integrated circuit of this embodiment, an n-type well 2 and a p-type well 3 are formed on a p-type semiconductor substrate 1. Moreover, a field insulating film 4 is formed on the boundary between the n-type well 2 and the p-type well 3 on the surface of the p-type semiconductor substrate 1.

The n-type well 2 is provided with the transistor Tp in the form of a p-channel MOS FET, serving as a component of an inverter circuit, and a p-channel MOS FET serving as a switching transistor Tps, which is a feature of this invention. The drain 5 of the switching transistor Tps and the source 5 of the transistor Tp for the inverter circuit are adjacently arranged in the same p-type semiconductor region.

The p-type well 3 is provided with the transistor Tn in the form of an n-channel MOS FET, which is a component of the inverter circuit, and an n-channel MOS FET serving as a switching transistor Tns, which is also a feature of this invention. The drain 10 of the switching transistor Tns and the source 10 of the transistor Tn for the inverter circuit are adjacently arranged in the same n-type semiconductor region.

Furthermore, a p-type semiconductor region 9, having a concentration lower than the concentrations of the source 5 and the drain 6, which are high-concentration p-type semiconductor regions of the transistor Tp of the p-channel MOS FET constituting a CMOS FET, and the source 5 and the drain 7, which are high-concentration p-type semiconductor regions of the switching transistor Tps, is formed on the source 5 and the drain 6 of the transistor Tp and on the source 5 and the drain 7 of the transistor Tps in the n-type well 2 and serves as a MOS FET having a LDD (Lightly Doped Drain) structure.

Similarly, an n-type semiconductor region 14, having a concentration lower than the concentrations of the source 10 and the drain 11, which are high-concentration n-type semiconductor regions of the transistor Tn of an n-channel MOS FET constituting a CMOS FET, and the source 10 and the drain 12, which are high-concentration n-type semiconductor regions of the switching transistor Tns of an n-channel MOS FET constituting a CMOS FET, is formed on the source 10 and the drain 11 of the transistor Tn and on the source 10 and the drain 12 of the transistor Tns in the p-type well 3 and serves as a MOS FET having a LDD structure.

The source 5 of the transistor Tp connects with a first power-supply-voltage line Vdd to which a power supply voltage Vdd of, for example, approx. 5 V is applied, its gate electrode G connects with an input line IN, and its drain 6 connects with an output line OUT. The source 10 of the transistor Tn connects with a second power-supply-voltage line (source line) Vss to which a power supply voltage Vss of, for example, 0 v (ground voltage) (under a potential state lower than that of the first power-supply-voltage line), its gate electrode G connects with an input line IN, and its drain 11 connects with an output line OUT.

Moreover, a control signal line Cw1, to which a control signal Cw1 is supplied is connected to the gate electrode G of the switching transistor Tps in order to control the transistor Tps. Furthermore, the n-type well 2 connects with a well feeding line Vw1 to which a well feeding voltage Vw1 is applied through an n-type semiconductor region 13 and the well feeding line Vw1 is connected to the source 7 of the switching transistor Tps. Also, a control signal line Csu, to which a control signal Csu is supplied, is connected to the gate electrode G of the switching transistor Tns in order to control the transistor Tns. Finally, the p-type well 3 connects with a well feeding line Vsu to which a well feeding voltage Vsu is applied through a p-type semiconductor region 8 and the well feeding line Vsu is connected to the source 12 of the switching transistor Tns. In this case, because the p-type well 3 and the p-type semiconductor substrate 1 are of the same conductivity type, the well feeding line Vsu is brought into a mode of the substrate feeding line of the p-type semiconductor substrate 1.

In the case of the CMOS semiconductor integrated circuit of the above embodiment, the n-type well 2 is newly provided with the switching transistor Tps and the p-type well 3 is newly provided with the switching transistor Tns in accordance with the present invention. Moreover, the control signal line Cw1 is newly connected to the gate electrode G of the switching transistor Tps and the well feeding line Vw1 is newly connected to the source 7 of the transistor Tps in order to control the transistor Tps. Furthermore, the control signal line Csu is newly connected to the gate electrode G of the switching transistor Tns and the well feeding line Vsu is newly connected to the source 12 of the transistor Tns in order to control the transistor Tns in accordance with the present invention.

Therefore, the threshold voltage Vthp of the p-channel MOS FET in the n-type well 2 and the threshold voltage Vthn of the n-channel MOS FET in the p-type well 3 can be controlled to desired values by adjusting the well feeding lines Vw1 and Vsu. That is, a change value ΔVthp of the threshold voltage of the p-channel MOS FET in the n-type well 2 can be controlled by adjusting the well feeding line Vw1 in accordance with the expression:

$$\Delta V_{thp} = K_{BP}\{(V_{w1} - V_{dd} + 2\Phi_F)^{1/2} - (2\Phi_F)^{1/2}\}.$$

Moreover, the threshold voltage ΔVthn of the n-channel MOS FET in the p-type well 3 can be controlled by adjusting the well feeding line Vsu in accordance with the expression:

$\Delta V_{thn}=KBN\{(Vss-Vsu+2\Phi F)^{1/2}(2\Phi F)^{-1/2}\}$.

In these expressions, KBP denotes the substrate effect constant of a p-channel MOS FET, KBN denotes the substrate effect constant of an n-channel MOS FET, and ~F denotes the built-in potential of a semiconductor.

Figures 4, 5:
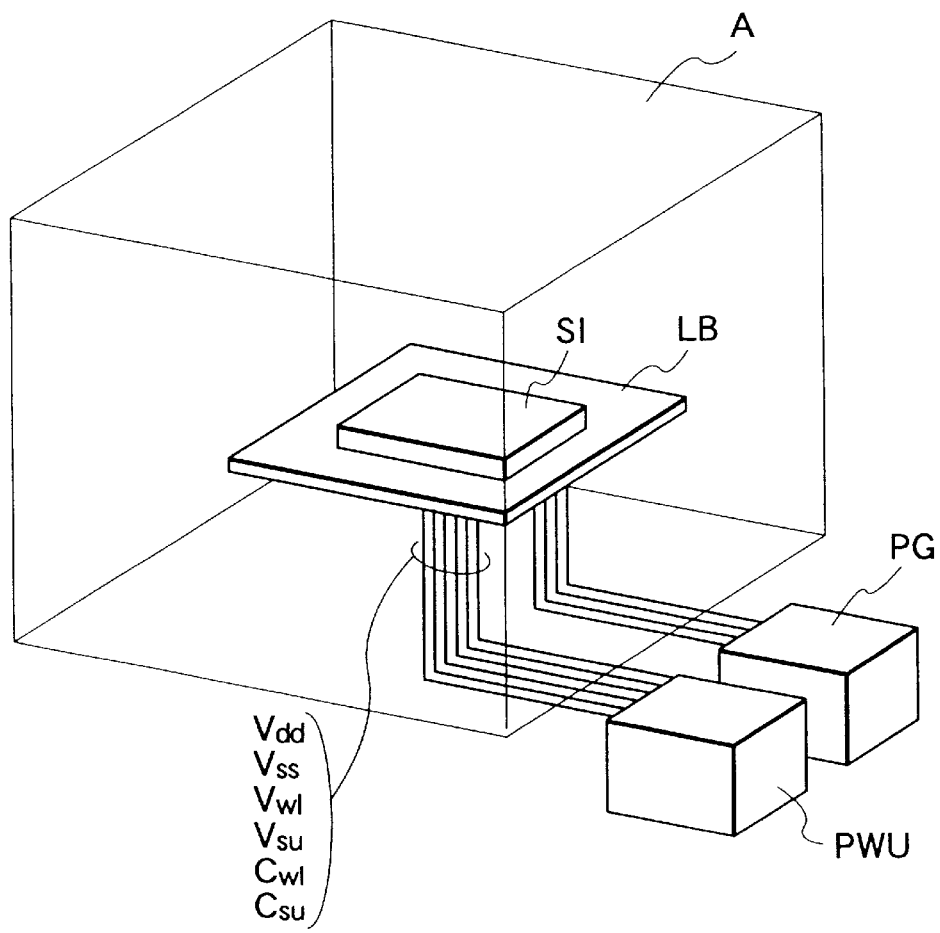
FIG. 4 is a table showing potentials to be applied to a well feeding line and a control signal line under normal operation and during a test of the semiconductor integrated circuit in FIG. 1.
FIG. 5 is a diagrammatic perspective view of an aging tester for explaining an aging test.

FIG. 4 shows voltages to be applied to the well feeding lines Vwl and VSU and the control signal lines Cwl and Csu during an aging test and under normal operation of the semiconductor integrated circuit of this embodiment. In FIG. 4, VBB denotes a positive predetermined reference voltage.

First, during an aging test, the switching transistors Tps and Tns are turned off by applying Vwl(Vdd+ΔVBB) and Vsu(Vss−ΔVBB) to the control signal lines Cwl and Csu, respectively. Then, voltages Vdd+ΔVBB and Vss−ΔVBB are applied to the well feeding lines Vwl and Vsu, respectively, from an external unit respectively. Thereby, it is possible to avoid the problem of leakage current during the aging test and, moreover, to avoid the problem of thermal runaway due to leakage current.

Under normal operation, the switching transistors Tps and Tns are turned on by applying power supply voltages Vss and Vdd to the control signal lines Cwl and Csu, respectively. Thereby, the power-supply-voltage lines Vdd and vss are electrically connected with the well feeding lines Vwl and vsu to set the substrate potentials of the transistors Tp and Tn to the power supply voltages Vdd and Vss, respectively. In this way, because fluctuation of the substrate potentials of the transistors Tp and Tn can be controlled, it is possible to prevent the latch-up phenomenon and fluctuation of the operation speed due to fluctuation of the substrate potentials and to secure the operational reliability of a semiconductor integrated circuit.

Thus, in the case of-the CMOS semiconductor integrated circuit of this embodiment, to bring the switching transistor Tps formed in the n-type well 2 and the switching transistor Tns formed in the p-type well 3 into the off state, that is, the unconnected state, the voltage of the control signal line Cwl for controlling the switching transistor Tps is equalized with the first power supply voltage Vdd and the voltage of the control signal line Csu for controlling the switching transistor Tns is equalized with the second power supply voltage Vss.

Therefore, according to the CMOS semiconductor integrated circuit of this embodiment, it is possible to set the potentials of the n-type well 2 and the p-type well 3 independently of those of the first power-supply-voltage line Vdd and the second power-supply-voltage line Vss by bringing the switching transistor Tps formed in the n-type well 2 and the switching transistor Tns formed in the p-type well 3 into the off-state, that is, the unconnected state, during a leakage current test and an aging test. Thus, it is possible to perform a test under the normal state by controlling the leakage current.

Moreover, according to the CMOS semiconductor integrated circuit of this embodiment, it is possible to perform a normal operation under a state in which the latch-up phenomenon is prevented by bringing the switching transistor Tps formed in the n-type well 2 and the switching transistor Tns formed in the p-type well 3 into the on-state, that is, a connected state, under normal operation when a leakage current test or an aging test is not being performed.

Furthermore, according to the CMOS semiconductor integrated circuit of this embodiment, it is possible to control the threshold voltage of a MOS FET and prevent the latch-up phenomenon from occurring because a back bias can be supplied to the n-type well 2 and the p-type well 3 according to necessity. Therefore, it is possible to constitute a high-performance and high-reliability semiconductor integrated circuit.

Furthermore, according to the CMOS semiconductor integrated circuit of this embodiment, it is possible to control the threshold voltage of a MOS FET and short-circuit a power supply system necessary for circuit operations and a power supply system independent of the former power supply system through the switching transistors Tps and Tns according to necessity, because the n-type well 2 and the p-type well 3 are provided with the control signal line Cwl, the well feeding line VW1, the control signal line Csu, and the well feeding line Vsu, of which the first power-supply-voltage line Vdd to which the power supply voltage Vdd necessary for circuit operations and the second power-supply-voltage line Vss to which the power supply voltage Vss is applied are mutually independent.

Thus, according to the CMOS semiconductor integrated circuit of this embodiment, it is possible to prevent the latch-up phenomenon during a leakage current test, an aging test, and under normal operation. Therefore, it is possible to constitute a high-performance high-reliability semiconductor integrated circuit.

FIG. 5 schematically shows the arrangement for an aging test. One CMOS semiconductor integrated circuit SI or more is mounted on a wiring substrate LB for aging and is set in an aging oven A.

A power supply unit PWU is provided for supplying the power supply voltages Vdd and Vss, well feeding voltages Vw1 and Vsu, and well feeding control signals Cwl and Csu to the semiconductor integrated circuit SI. A pattern generator PG is provided for generating a pulse signal and performing a test by supplying the pulse signal to the semiconductor integrated circuit SI and thereby activating circuits inside of the semiconductor integrated circuit SI.

To start the aging test, the initial failure of the semiconductor integrated circuit SI is screened by setting the temperature in the aging oven A in which the semiconductor integrated circuit SI is stored to a predetermined value and, thereafter, keeping the state for a certain period.

A method of fabricating the CMOS semiconductor integrated circuit of this embodiment will be described with reference to FIGS. 6 to 9, which are schematic sectional views showing the steps of fabricating the CMOS semiconductor integrated circuit of this embodiment.

Figure 6:
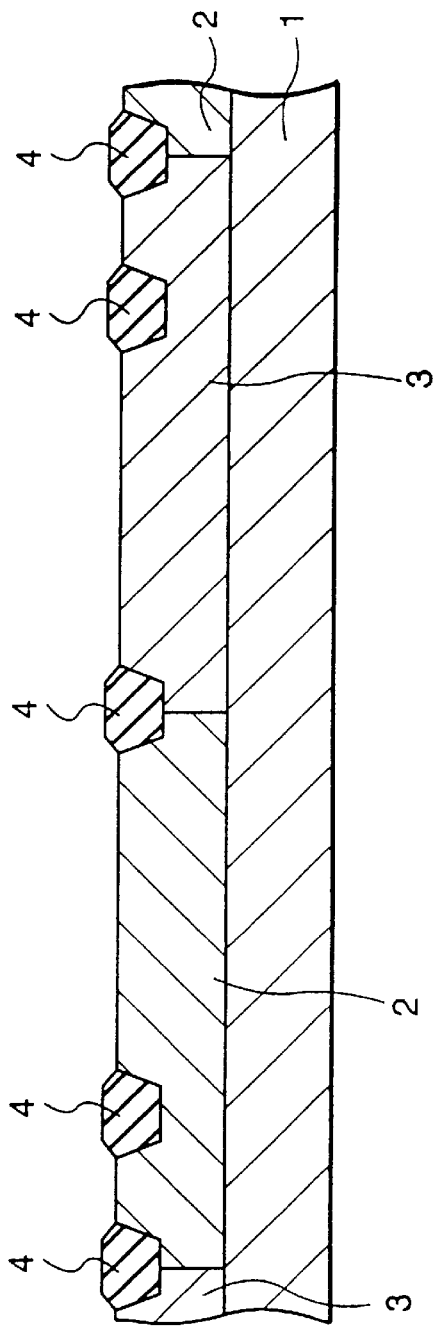
FIG. 6 is a schematic sectional view showing a fabrication step of the semiconductor integrated circuit of the present invention.

First, as shown in FIG. 6, a p-type semiconductor substrate 1 is prepared, an n-type well 2 and a p-type well 3 are formed on the surface of the p-type semiconductor substrate 1 by an ion implantation method, and then a field insulating film 4 made of, for example, a silicon oxide film, is formed on a selective region of the surface.

Figure 7:
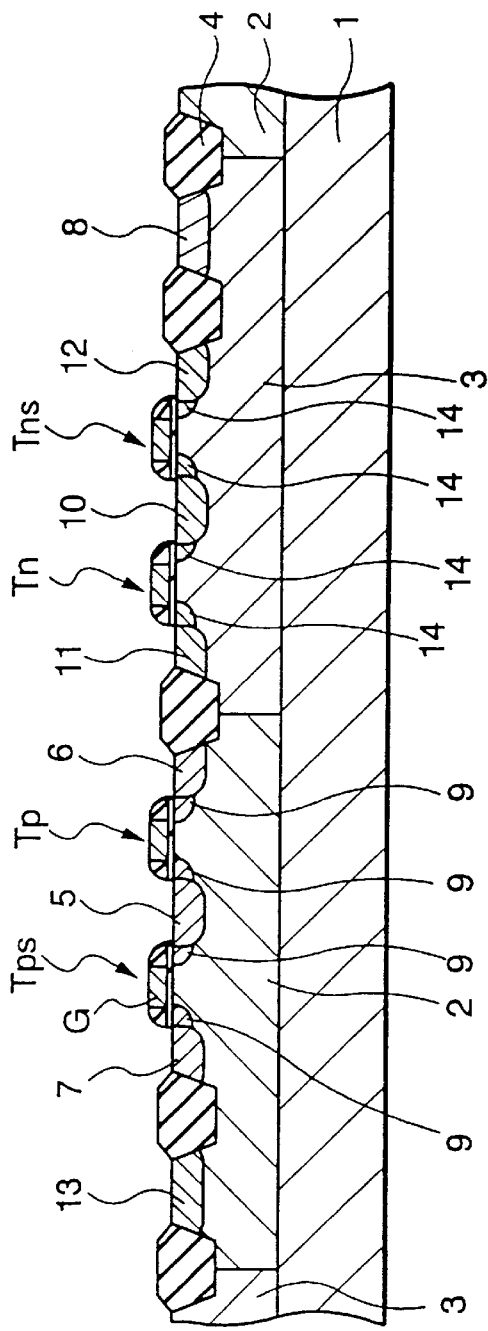
FIG. 7 is a schematic sectional view showing a fabrication step of the semiconductor integrated circuit of the present invention.

Then, as shown in FIG. 7, a transistor Tp of a p-channel MOS FET constituting a CMOS FET and a p-channel MOS FET serving as a switching transistor Tps, which represents a feature of this invention, are formed in the n-type well 2 in the same step. Moreover, a transistor Tn of an n-channel MOS FET constituting a CMOS FET and a switching transistor Tns, which represents a feature of this invention, are formed in the p-type well 3 in the same step. In this case, a gate insulating film is formed at the lower side of the gate electrode G of each of the above various MOS FETs and a side-wall insulating film is formed on the side wall of the gate electrode G.

Moreover, a p-type semiconductor region 9 is formed on the source 5 and the drain 7 of the switching transistor Tps in the n-type well 2 at the same time in the same step as the step of forming the source 5 and the drain 6, serving as high-concentration p-type semiconductor regions of the transistor Tp of a p-channel MOS FET constituting a CMOS FET, by an ion implantation method. Furthermore, the source 5 of the transistor Tp and the drain 5 of the switching transistor TpS are adjacently arranged in the same high-concentration p-type semiconductor region.

A p-type semiconductor region 9 having a concentration lower than that of the high-concentration p-type semiconductor region is formed in the high-concentration p-type semiconductor region as a MOS FET having an LDD (Lightly Doped Drain) structure. Furthermore, the drain 10 and the source 12 of the switching transistor Tns are formed in the p-type well 3 in the same step as the step of forming the source 10 and the drain 11, serving as high-concentration n-type semiconductor regions of the transistor Tn of an n-channel MOS FET constituting a CMOS FET, by an ion implantation method, and moreover, an n-type semiconductor region 13 is formed in the n-type well 2 at the same time.

The source 10 of the transistor Tn and the source 10 of the switching transistor Tns are adjacently arranged in the same high-concentration n-type semiconductor region. Furthermore, an n-type semiconductor region 14 having a concentration lower than that of the high-concentration n-type semiconductor region is formed in the n-type semiconductor region as a MOS FET having an LDD structure.

Figure 8:
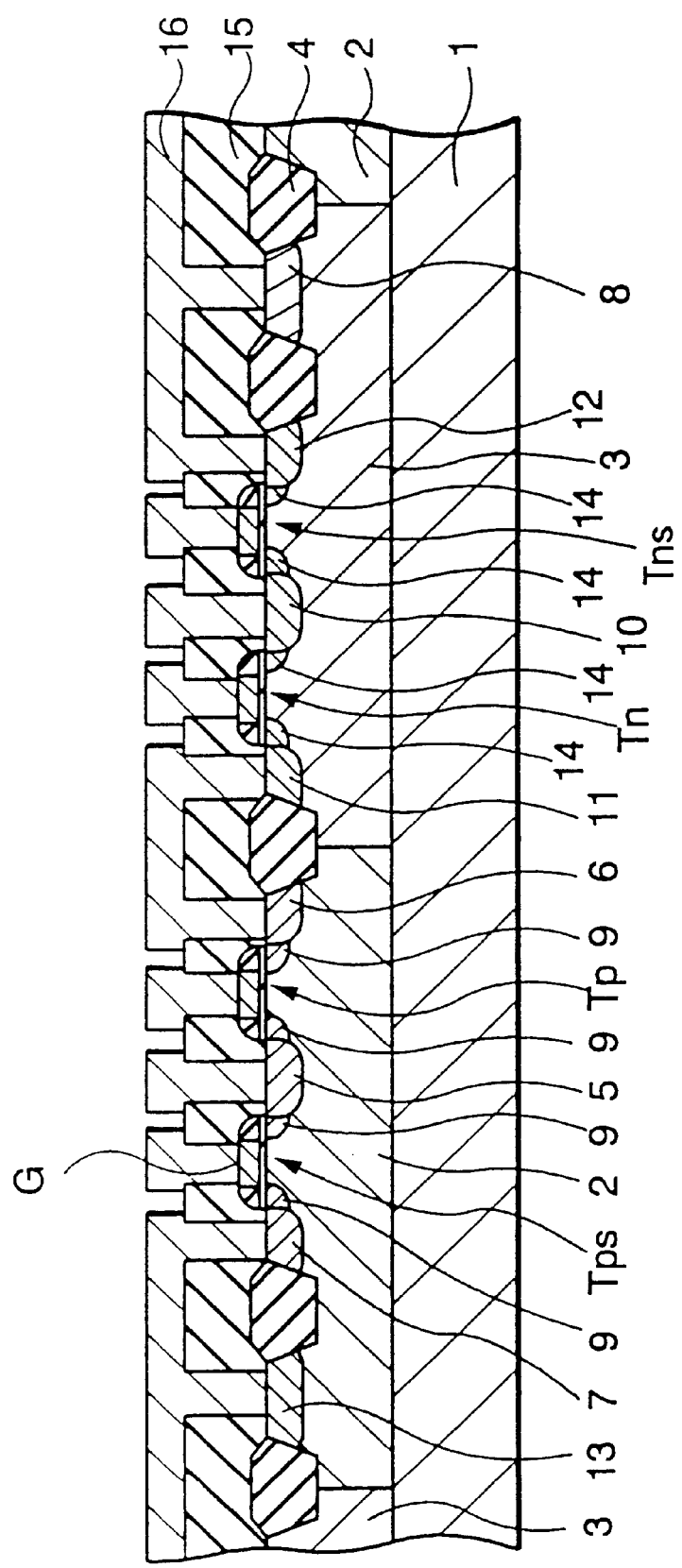
FIG. 8 is a schematic sectional view showing a fabrication step of the semiconductor integrated circuit of the present invention.

Then, as shown in FIG. 8, a silicon oxide film, for example, is deposited on the p-type semiconductor substrate 1 by the CVD (Chemical vapor Deposition) method to form an insulating film 15. Then, a through-hole is formed on a selective region of the insulating film 15 by using photolithography and selective etching.

Thereafter, an aluminum film, for example, is deposited on the p-type semiconductor substrate 1 by a sputtering method to form a wiring layer 16. Then, a selective region of the wiring layer 16 is removed using photolithography and selective etching to form a patterned wiring layer 16.

Figure 9:
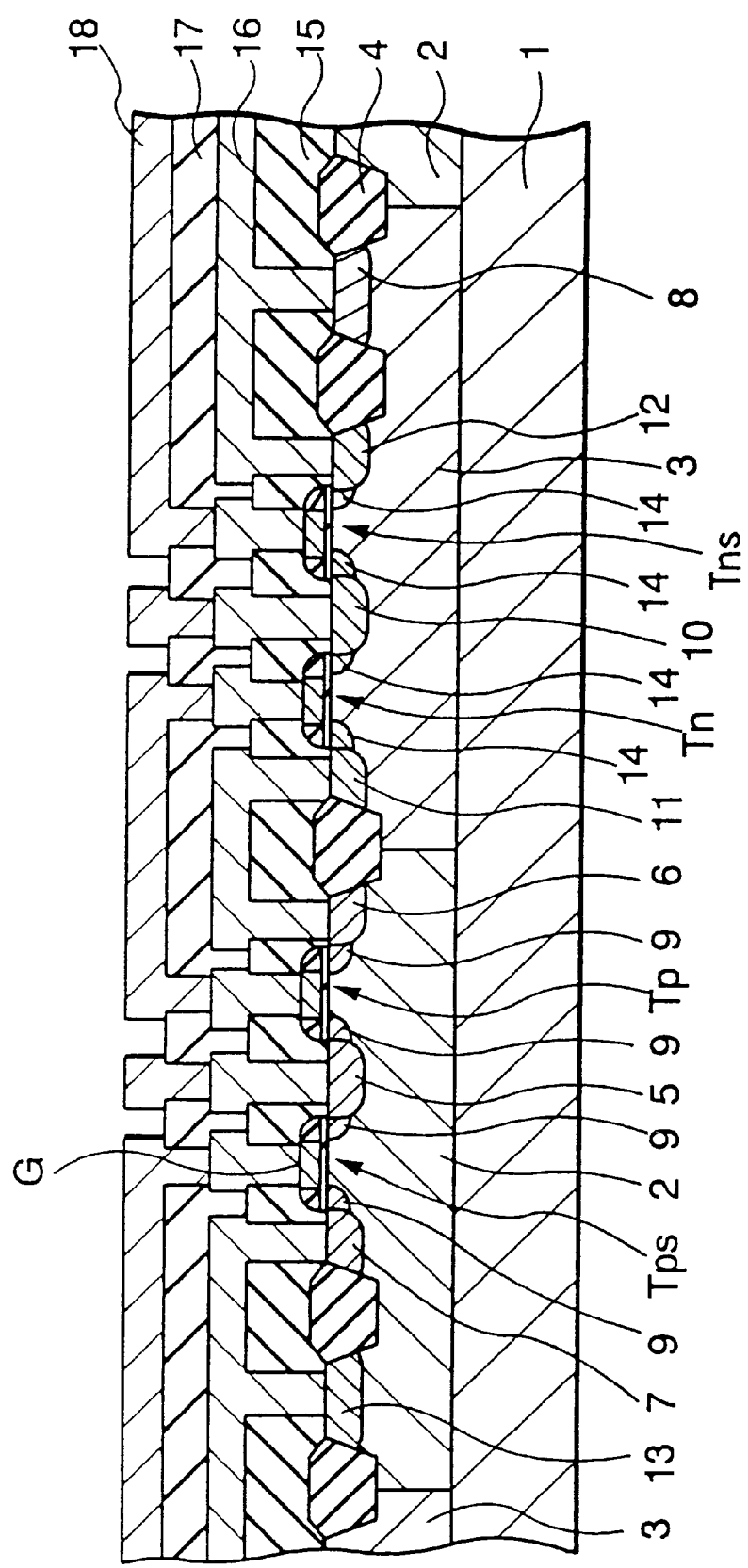
FIG. 9 is a schematic sectional view showing a fabrication step of the semiconductor integrated circuit of the present invention.

Next, as shown in FIG. 9, a silicon oxide film, for example, is deposited on the p-type semiconductor substrate 1 by a CVD method to form an insulating film 17. Thereafter, a through-hole is formed on a selective region of the insulating film 17 by using photolithography and selective etching. Then, an aluminum film, for example, is deposited on the p-type semiconductor substrate 1 by the sputtering method to form a wiring layer 18.

Next, the selective region of the wiring layer 18 is removed by using photolithography and selective etching to form a patterned wiring layer 18. In this case, a first power-supply-voltage line Vdd, second power-supply-voltage line Vss, input line IN, and output line OUT of a CMOS FET are formed by the wiring layers 16 and 18 in the same step.

Moreover, the control signal line Cwl for controlling the switching transistor Tps, the well feeding line Vwl connected to the source of the switching transistor Tps and the n-type well, the control signal line Csu for controlling the switching transistor Tns, and the well feeding line Vsu connected to the source of the switching transistor Tns and the p-type well 3 are formed by the wiring layers 16 and 18 in the same step. Thereafter, a multilayer wiring layer is formed on the p-type semiconductor substrate 1 by using known multilayer wiring techniques and then, a surface protection film (not illustrated) is formed to complete the CMOS semiconductor integrated circuit fabrication steps.

The above fabrication steps show a method of forming a p-type semiconductor substrate 1. However, it is also possible to realize a semiconductor region of a conductivity-type well which is opposite to the case of the above fabrication steps by using an n-type semiconductor substrate having a conductivity type opposite to that of the above method.

In the case of fabricating the CMOS semiconductor integrated circuit of this embodiment as described above, the transistor Tp of the p-channel MOS FET for constituting a CMOS FET and the switching transistor Tps, which is a feature of this embodiment are formed in the n-type well 2 in the same step. Furthermore, the transistor Tn of the n-channel MOS FET for constituting a CMOS FET and the switching transistor Tns, which is a feature of this embodiment, are formed in the p-type well 3 in the same step.

The first power-supply-voltage line Vdd, second power-supply-voltage line Vss, input line IN and output line ON of a CMOS FET are formed by the wiring layers 16 and 18 in the same step. Furthermore, the control signal line-Cwl for controlling the switching transistor Tps, the well feeding line Vwl connected to the source of the switching transistor Tps and the n-type well 2, the control signal line Csu for controlling the switching transistor Tns, and the well feeding line Vsu connected to the source of the switching transistor Tns and the p-type well 3 are formed by the wiring layers 16 and 18 in the same step.

Therefore, according to the method of fabricating the semiconductor integrated circuit of this embodiment, it is possible to form the switching transistors Tps and Tns and the control signal line Cwl, the well feeding line Vwl, the control signal line Csu, and the well feeding line Vsu connected to the transistors Tps and Tns in the same step as the step of forming a CMOS FET and the first power-supply-voltage line Vdd, the second power supply-voltage line vss, the input line IN, and the output line OUT connected to the CMOS FET. Thereby, it is possible to easily and simultaneously form these elements without adding a fabrication step.

Moreover, in the case of the method for fabricating the CMOS semiconductor integrated circuit of this embodiment as described above, the source 5 of the transistor Tp and the drain 5 of the switching transistor Tps are adjacently arranged in the same high-concentration p-type semiconductor region. Furthermore, the source 10 of the transistor Tn and the drain 10 of the switching transistor Tns are adjacently arranged in the same high-concentration semiconductor region.

Therefore, according to the method of fabricating the CMOS semiconductor integrated circuit of this embodiment as described above, it is possible to form the switching transistors Tps and Tns in a region occupying a minimum area. Thus, it is possible to improve the layout efficiency.

Now, another embodiment of the present invention will be described with reference to FIGS. 10 to 17. FIGS. 10 to 17 are circuit diagrams and a corresponding schematic layout diagram showing a modification of the logic gate of the CMOS semiconductor integrated circuit according to other embodiments of the present invention.

Each of FIGS. 10 to 17 shows one logic gate and moreover that switching transistors Tps and Tns are provided for each logic gate.

Figure 10:
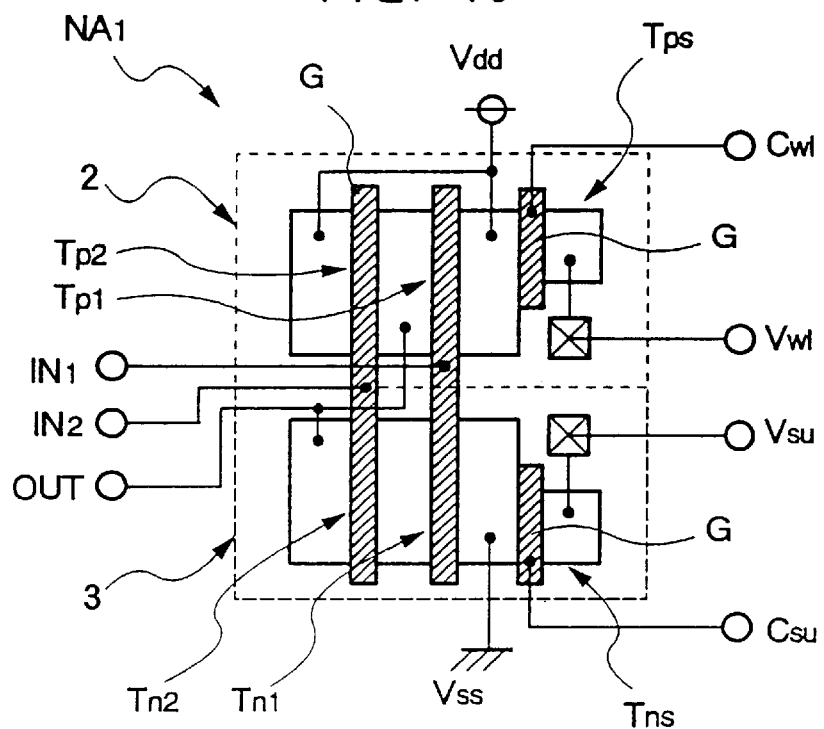
FIG. 10 is a schematic layout diagram showing a semiconductor integrated circuit representing another embodiment of the present invention.
Figure 11:
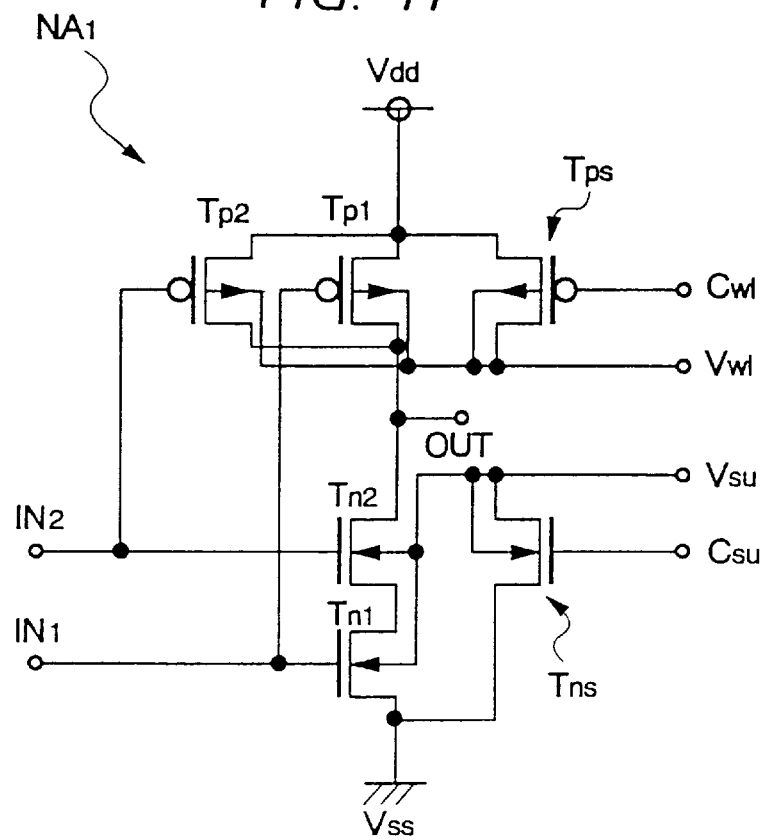
FIG. 11 is a circuit diagram of the logic gate in FIG. 10.

FIG. 10 is a schematic layout diagram showing a CMOS semiconductor integrated circuit having a 2-input NAND gate circuit NA1, and FIG. 11 is a circuit diagram of the circuit NA1.

The 2-input NAND gate circuit NA1 is constituted by electrically connecting two transistors Tp1 and Tp2, which are connected to each other in parallel, and two transistors Tn1 and Tn2 in series between power-supply-voltage lines Vdd and Vss. The transistors Tp1 and Tp2 each comprise a p-channel MOS FET and are formed in an n-type well 2. Moreover, the transistors Tn1 and Tn2 each comprise an n-channel MOS FET and are formed in a p-type well 3.

The gate electrodes of the transistors Tp1 and Tn1 are electrically connected to each other and, moreover, are electrically connected to an input line IN1. The gate electrodes of the transistors Tp2 and Tn2 are electrically connected to each other and, moreover, are electrically connected to an input line IN2. The drains of the transistors Tp1 and Tp2 and the drain of the transistor Tn2 are electrically connected to each other and, moreover, are electrically connected with an output line OUT.

Figure 12:
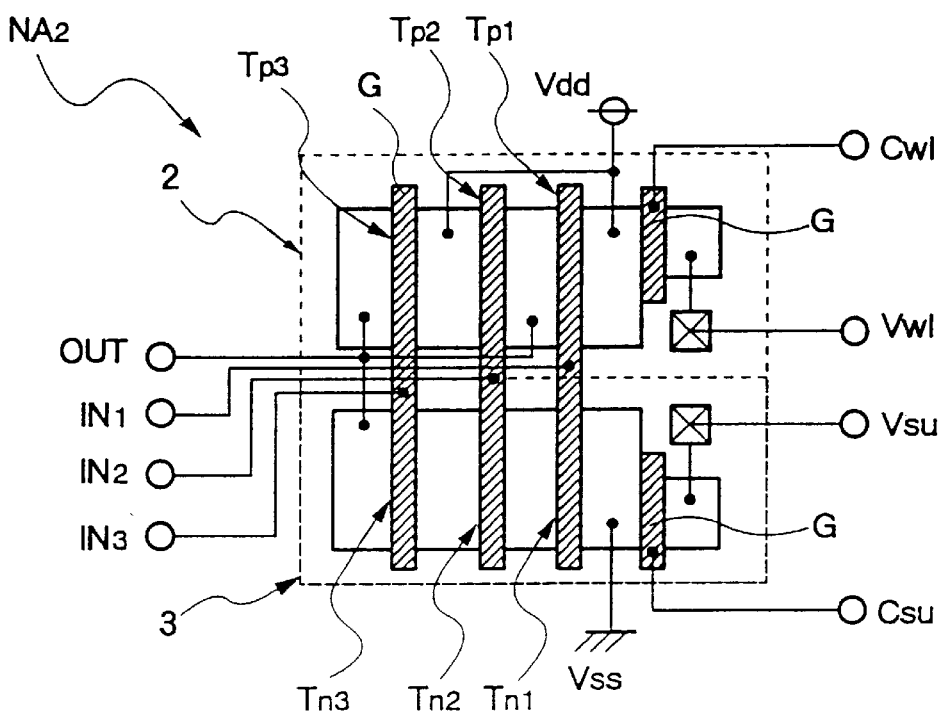
FIG. 12 is a schematic layout diagram showing a semiconductor integrated circuit representing still another embodiment of the present invention.
Figure 13:
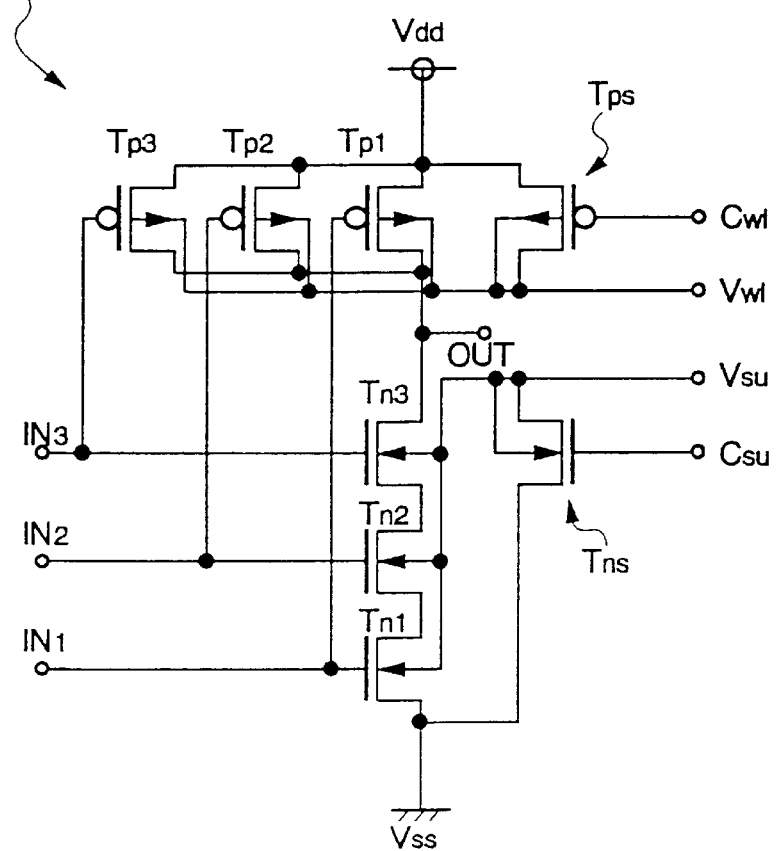
FIG. 13 is a circuit diagram of the logic gate in FIG. 12.

FIG. 12 is a schematic layout diagram showing a CMOS semiconductor integrated circuit having a 3-input NAND gate circuit NA2, and FIG. 13 is a circuit diagram of the circuit NA2.

The 3-input NAND gate circuit NA2 is constituted by electrically connecting three transistors Tp1, Tp2, and Tp3, which are connected to each other in parallel, and three transistors Tn1, Tn2, and Tn3 in series between power-supply-voltage lines Vdd and Vss. The transistors Tp1, Tp2, and Tp3 each comprise a p-channel MOS FET and are formed in an n-type well 2. Moreover, the transistors Tn1, Tn2, and Tn3 each comprise an n-channel MOS FET and are formed in a p-type well 3.

The gate electrodes of the transistors Tp1 and Tn1 are electrically connected to each other and, moreover, are electrically connected with an input line IN1. The gate electrodes of the transistors Tp2 and Tn2 are electrically connected to each other and, moreover, are electrically connected with an input line IN2. The gate electrodes of the transistors Tp3 and Tn3 are electrically connected to each other and, moreover, are electrically connected to an input line IN3. The drains of the transistors Tp1 to Tp3 and the drain of the transistor Tn3 are electrically connected to each other and, moreover, are electrically connected with an output line OUT.

Figure 14:
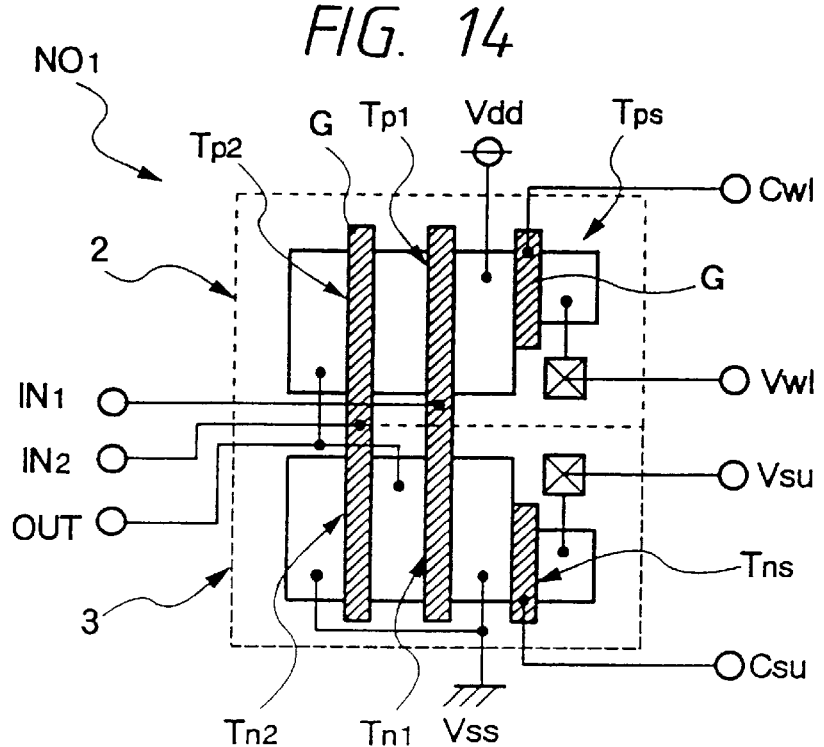
FIG. 14 is a schematic layout diagram showing a semiconductor integrated circuit representing yet still another embodiment of the present invention.
Figure 15:
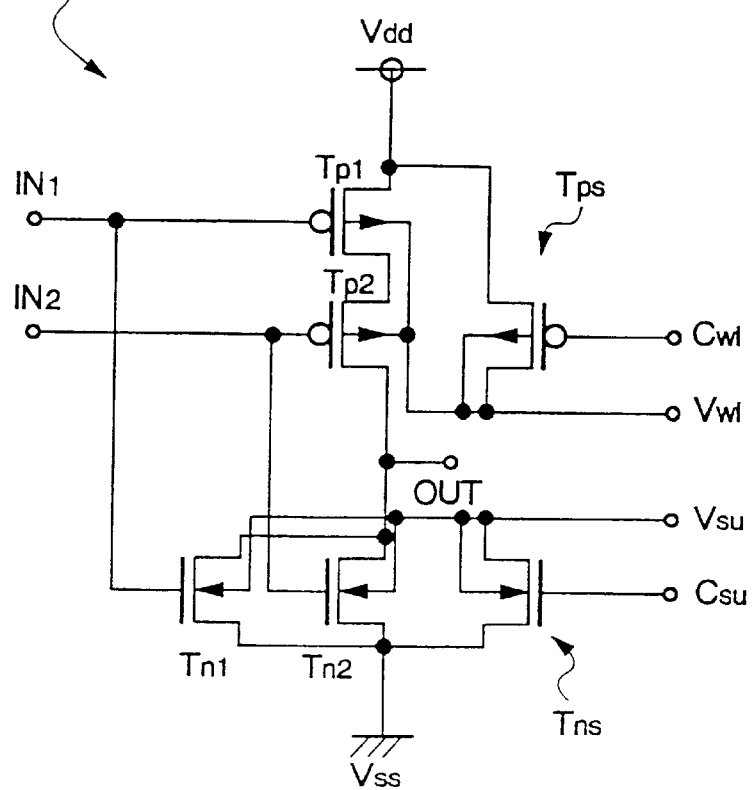
FIG. 15 is a circuit diagram of the logic gate in FIG. 14.

FIG. 14 is a schematic layout diagram showing a CMOS semiconductor integrated circuit having a 2-input NOR gate circuit NO1, and FIG. 15 is a circuit diagram of the circuit NOT. The 2-input NOR gate circuit has two transistors Tp1 and Tp2 and two transistors Tn1 and Tn2 in an n-type well 2 and a p-type well 3, respectively.

The 2-input NOR gate circuit NO1 is constituted by electrically connecting two transistors Tp1 and Tp2, which are connected to each other in series, and two transistors Tn1 and Tn2, which are connected to each other in parallel, as a series circuit between power-supply-voltage lines Vdd and Vss. The transistors Tp1 and Tp2 each comprise a p-channel MOS FET and are formed in an n-type well 2. Moreover, the transistors Tn1 and Tn2 each comprise an n-channel MOS FET and are formed in a p-type well 3.

The gate electrodes of the transistors Tp1 and Tn1 are electrically connected to each other and, moreover, are electrically connected with an input line IN1. The gate electrodes of the transistors Tp2 and Tn2 are electrically connected to each other and, moreover, are electrically connected with an input line IN2. The drain of the transistor Tp2 and the drains of the transistors Tn1 and Tn2 are electrically connected to each other and, moreover, are electrically connected with an output line OUT.

Figure 16:
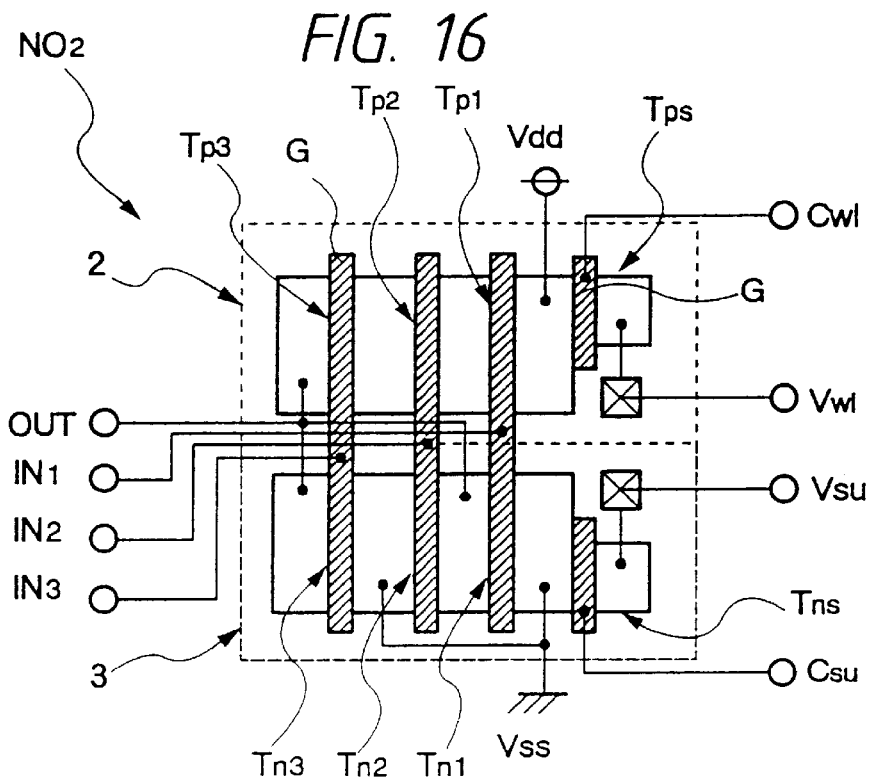
FIG. 16 is a schematic layout diagram showing a semiconductor integrated circuit representing still another embodiment of the present invention.
Figure 17:
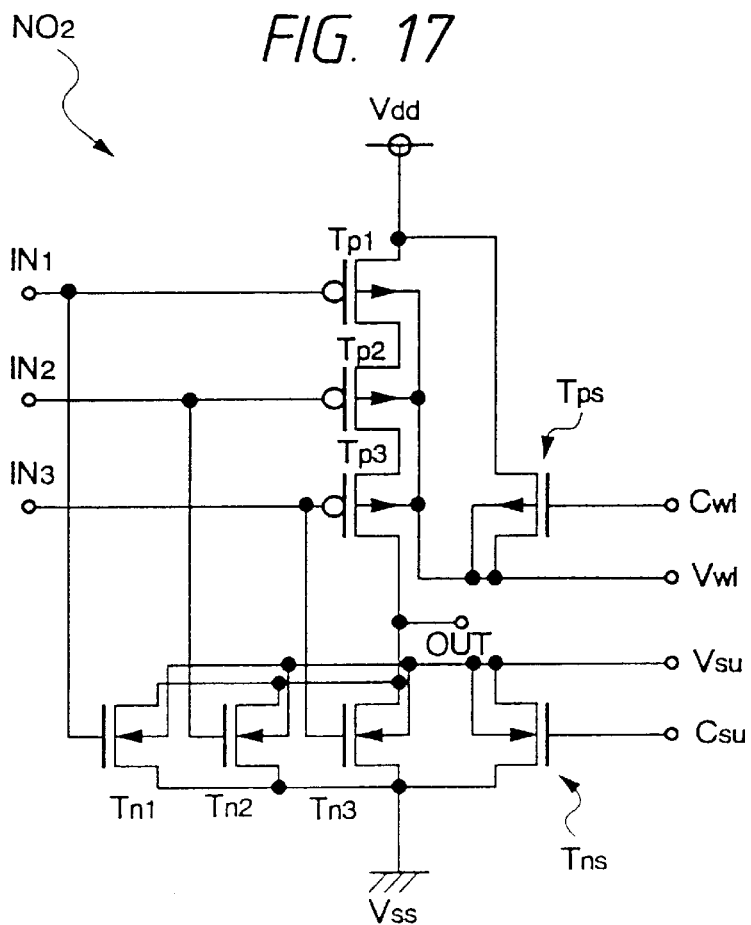
FIG. 17 is a circuit diagram of the logic gate in FIG. 16.

FIG. 16 is a schematic layout diagram of a CMOS semiconductor integrated circuit having a 3-input NOR gate circuit N02, and FIG. 17 is a circuit diagram of the circuit N02.

The 3-input NOR gate circuit NO2 is constituted by electrically connecting three transistors Tp1, Tp2, and Tp3, which are connected to each other in series, and three transistors Tn1, Tn2, and Tn3, which are connected to each other in parallel, in a series circuit between power-supply-voltage lines Vdd and Vss . The transistors Tp1, Tp2, and Tp3 each comprise a p-channel CMOS FET and are formed in an n-type well 2. Moreover, the transistors Tn1, Tn2, and Tn3 each comprise an n-channel MOS FET and are formed in a p-type well 3.

The gate electrodes of the transistors Tp1 and Tn1 are electrically connected to each other and, moreover, are electrically connected with an input line IN1. The gate electrodes of the transistors Tp2 and Tn2 are electrically connected to each other and, moreover, are electrically connected with an input line IN2. The gate electrodes of the transistors Tp3 and Tn3 are electrically connected to each other and, moreover, are electrically connected with an input line IN3. The drain of the transistor Tp3 and the drains of the transistors Tn1, Tn2, and Tn3 are electrically connected to each other and, moreover, are electrically connected with an output line OUT.

As shown in FIGS. 10 to 17, by arranging switching transistors Tps and Tns, each comprising a MOS FET in the n-type well 2 and the p-type well 3 similar to the case of the CMOS semiconductor integrated circuit of the above embodiment 1 and using control signal lines Cwl and Csu for controlling the switching transistors Tps and Tns, as well as a well feeding line Vwl connected to the n-type well 2 and a well feeding line Vsu connected to the p-type well 3, it is possible to prevent the latch-up phenomenon and a fluctuation of the operation speeds particularly under normal operation of a semiconductor integrated circuit, thereby to realize a high-performance and high-reliability semiconductor integrated circuit.

Moreover, when performing a test of a semiconductor integrated circuit, it is possible to control the leakage current and, moreover, control thermal runaway due to the leakage current. Therefore, it is possible to improve the yield and reliability of semiconductor integrated circuits.

Figure 18:
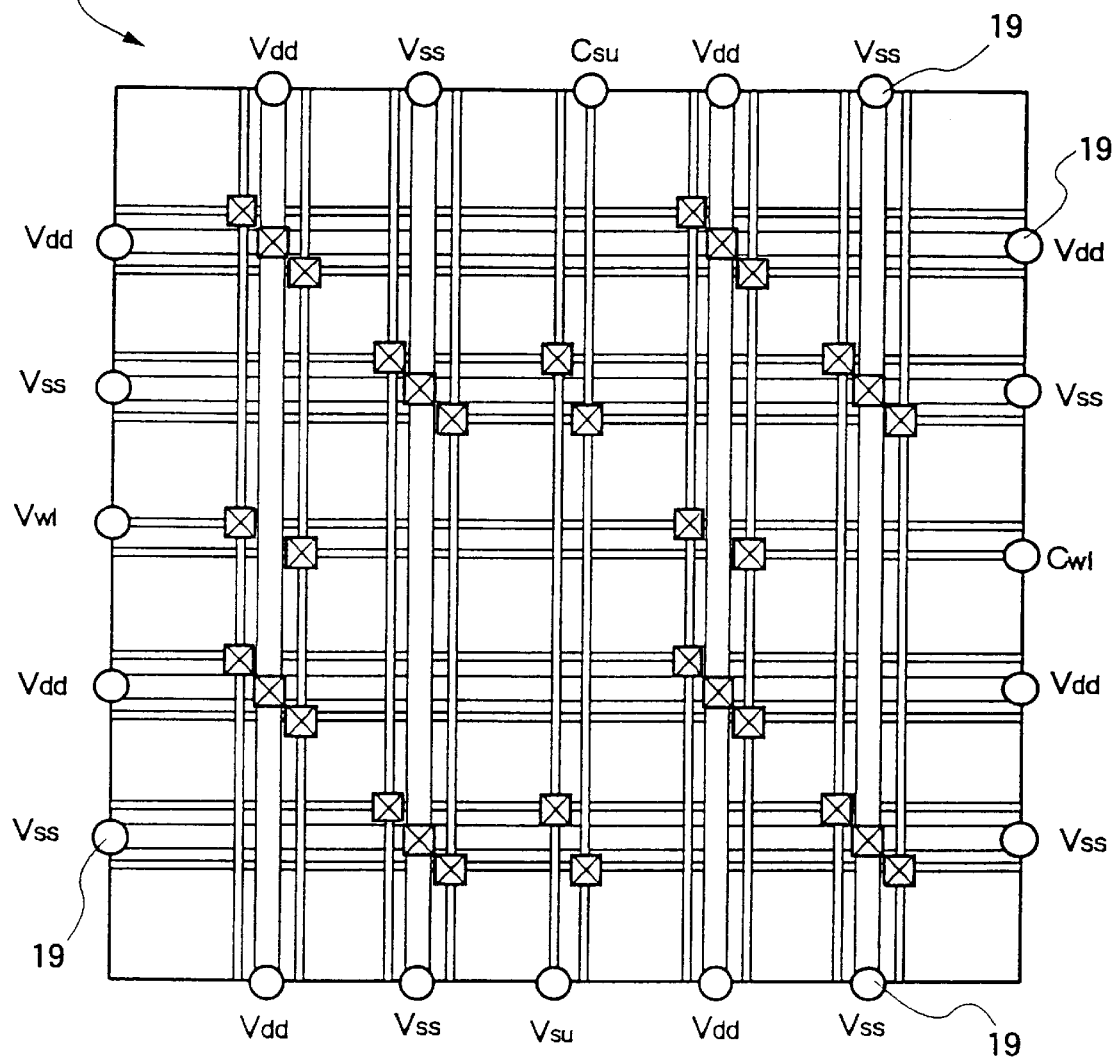
FIG. 18 is a top plan view schematically showing the semiconductor chip of the semiconductor integrated circuit according to the present invention.

Still another embodiment of the present invention will be described with reference to FIG. 18. FIG. 18 schematically shows the arrangement of power-supply-voltage lines and control signal lines in a semiconductor chip SC of the CMOS semiconductor integrated circuit of this invention.

As shown in FIG. 18, an approach in which wirings are arranged like a lattice can be applied to the wiring layout of the CMOS semiconductor integrated circuit of this embodiment. A pin 19 is formed at the ends of each wiring and power supply voltages Vdd and Vss necessary for circuit operations are inputted through a plurality of the pins 19. Well feeding lines Vwl and Vsu are connected to the input of the internal circuit of the semiconductor chip SC through a certain pin 19 in the semiconductor chip SC. Moreover, control signal lines Cwl and Csu are connected to the input of the internal circuit of the semiconductor SC through a certain pin 19.

According to the CMOS semiconductor integrated circuit of this embodiment, the control signal lines Cwl and Csu and the well feeding lines Vwl and Vsu are electrically connected with the power-supply-voltage lines vdd and VSS through a large resistor, respectively, and the control signal lines Cwl and Csu and the well feeding lines Vwl and Vsu are fixed to a predetermined potential during normal operation of the semiconductor integrated circuit. Thereby, under normal operation of the semiconductor integrated circuit, it is possible to make the semiconductor integrated circuit perform a desired operation without supplying a predetermined signal or voltage to the control signal lines Cwl and Csu and well feeding lines Vwl and Vsu from an external unit. Of course, it is also possible to supply a predetermined signal or voltage from an external unit, if desired.

Moreover, during a test of the semiconductor integrated circuit, a predetermined signal or voltage is forcibly supplied to the control signal lines Cwl and Csu and well feeding lines Vwl and Vsu from an external unit through the pins 19 by using a power supply unit having a resistance smaller than that of the above-mentioned large resistor.

Still another embodiment of the present invention will be described with reference to FIG. 19, which shows a top view of an essential portion of a semiconductor chip SC. An n-type well 2 and a p-type well 3 are formed on the semiconductor chip SC so as to extend along the transverse direction in FIG. 19, that is, along the direction of arrangement of the cell regions CL.

Figure 19:
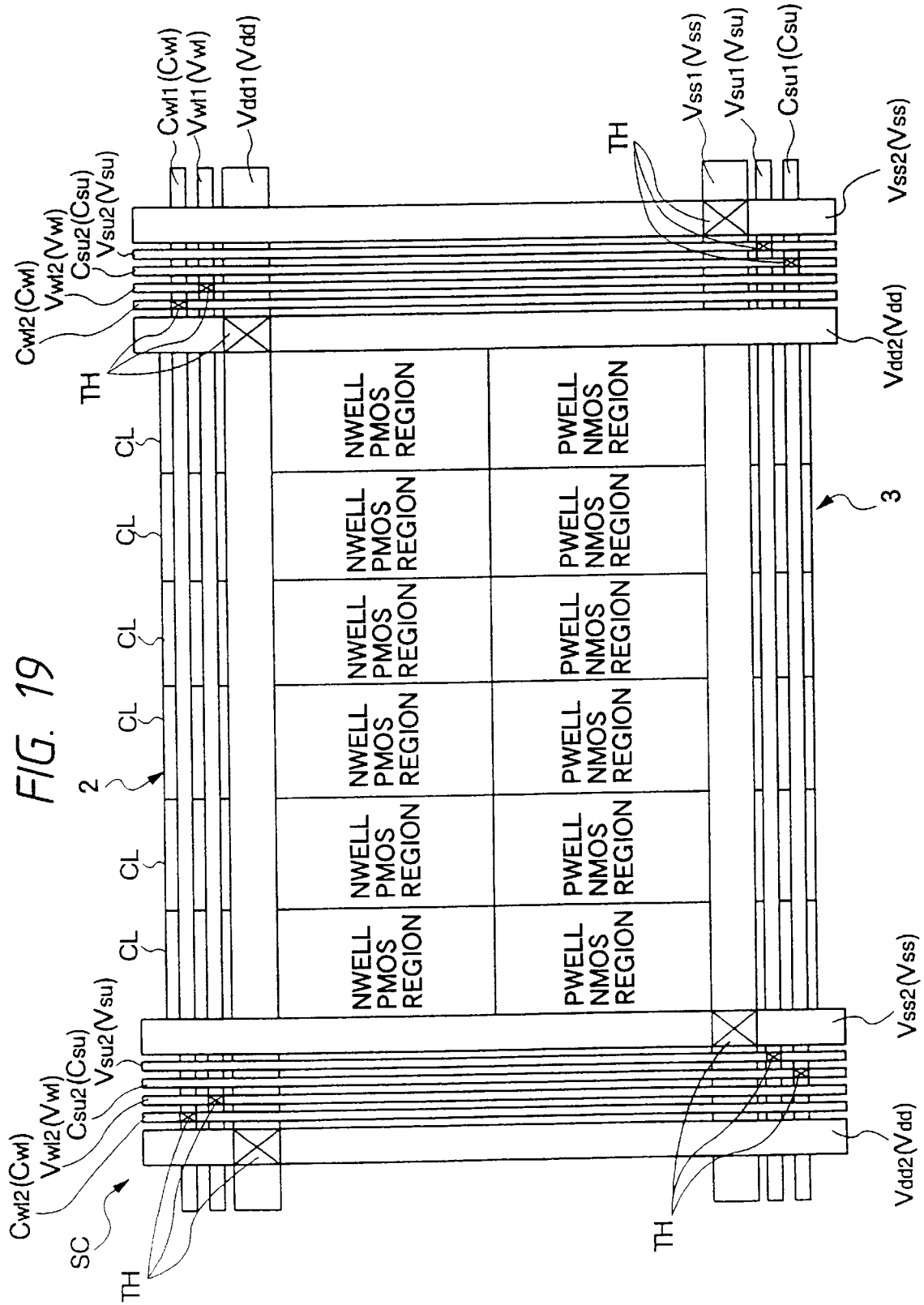
FIG. 19 is a top view of an essential portion of a semiconductor chip of the semiconductor integrated circuit of still another embodiment of the present invention.

In FIG. 19, the n-type well 2 and the p-type well 3 are shown as if each of them is divided into a plurality of wells. However, this shows the partition of one cell region CL, and each of the n-type well 2 and the p-type well 3 is not divided into a plurality of wells. That is, the wells 2 and 3 are integrally formed, that is, they are electrically connected as a semiconductor region in which predetermined impurity distributions are continued.

The cell region CL is a region in which a group of devices required to form a logic gate of the basic unit are arranged and its range is set so as to include the n-type well 2 and the p-type well 3. Moreover, power-supply-voltage lines Vdd and Vss, well feeding lines Vwl and Vsu, and the control signal lines Cwl and Csu are arranged on the principal plane of the semiconductor chip SC so as to enclose a group of the cell regions CL. Furthermore, the power-supply-voltage lines Vdd and Vss, the well feeding lines Vwl and Vsu, and the control signal lines Cwl and Csu are arranged on the principal plane of the semiconductor chip SC like a lattice. FIG. 19 shows the basic unit of the lattice.

A power-supply-voltage line Vdd1, the well feeding line Vwl1, and the control signal line Cwl1 are arranged near the longitudinal ends (upper side of FIG. 19) of the cell regions CL so as to cross each cell region CL, while the lines are extended along the arrangement direction of the cell regions CL. The power-supply-voltage line Vdd1, the well feeding line Vwl1, and the control signal line Cwl1 are arranged in order along the direction toward the outer boundary of each cell region CL from the center of the region CL.

A power-supply-voltage line Vss1, the well feeding line Vsu1, and the control signal line Csu1 are arranged near the longitudinal ends (lower side of FIG. 19) of the cell regions CL so as to cross each cell region CL, while the lines are extended along the arrangement direction of the cell regions CL. The power-supply-voltage line Vss1, the well feeding line Vsu1, and the control signal line Csu1 are arranged in order along the direction toward the outer boundary of each cell region CL from the center of the region CL. These power-supply-voltage lines Vdd1 and Vss1, the well feeding lines Vwl1 and Vsu1, and the control signal lines Cwl1 and Csu1 are made of, for example, aluminum or an aluminum alloy and are formed on the first wiring layer.

Moreover, power-supply-voltage lines Vdd2, Vss2, the well feeding lines Vwl2 and VSU2, and the control signal lines Cw12 and Csu2 are arranged so as to be perpendicular to the arrangement direction of the cell regions CL while they are extended. Furthermore, power-supply-voltage lines Vdd2 and Vss2, the well feeding lines Vwl2 and Vsu2, and the control signal lines Cw12 and Csu2 are arranged so that the well feeding lines Vwl2 and Vsu2 and control signal lines Cw12 and Csu2 are between the power-supply-voltage lines Vdd2 and Vss2. These power-supply-voltage lines Vdd2 and Vss2, the well feeding lines Vw12 and VSU2, and the control signal lines Cw12 and Csu2 are made of, for example, aluminum or an aluminum alloy and are formed on the second wiring layer.

The power-supply-voltage lines Vdd2 and Vss2, the well feeding lines Vw12 and Vsu2, and the control signal lines Cw12 and Csu2, which are arranged on the second wiring layer, are electrically connected through connection hole or intersections with the power-supply-voltage lines Vdd1 and Vss1, the well feeding lines Vwl1 and Vsu1, and the control signal lines Cwl1 and Csu1, which are arranged on the first wiring layer.

This embodiment has the following structure. First, one switching transistor Tps and one switching transistor Tns (see FIG. 3, etc.) are arranged for each cell region CL, that is, for each logic gate, similar to the case of the preceding embodiment. Therefore, it is possible to obtain the same advantage as the preceding embodiment.

Figure 20:
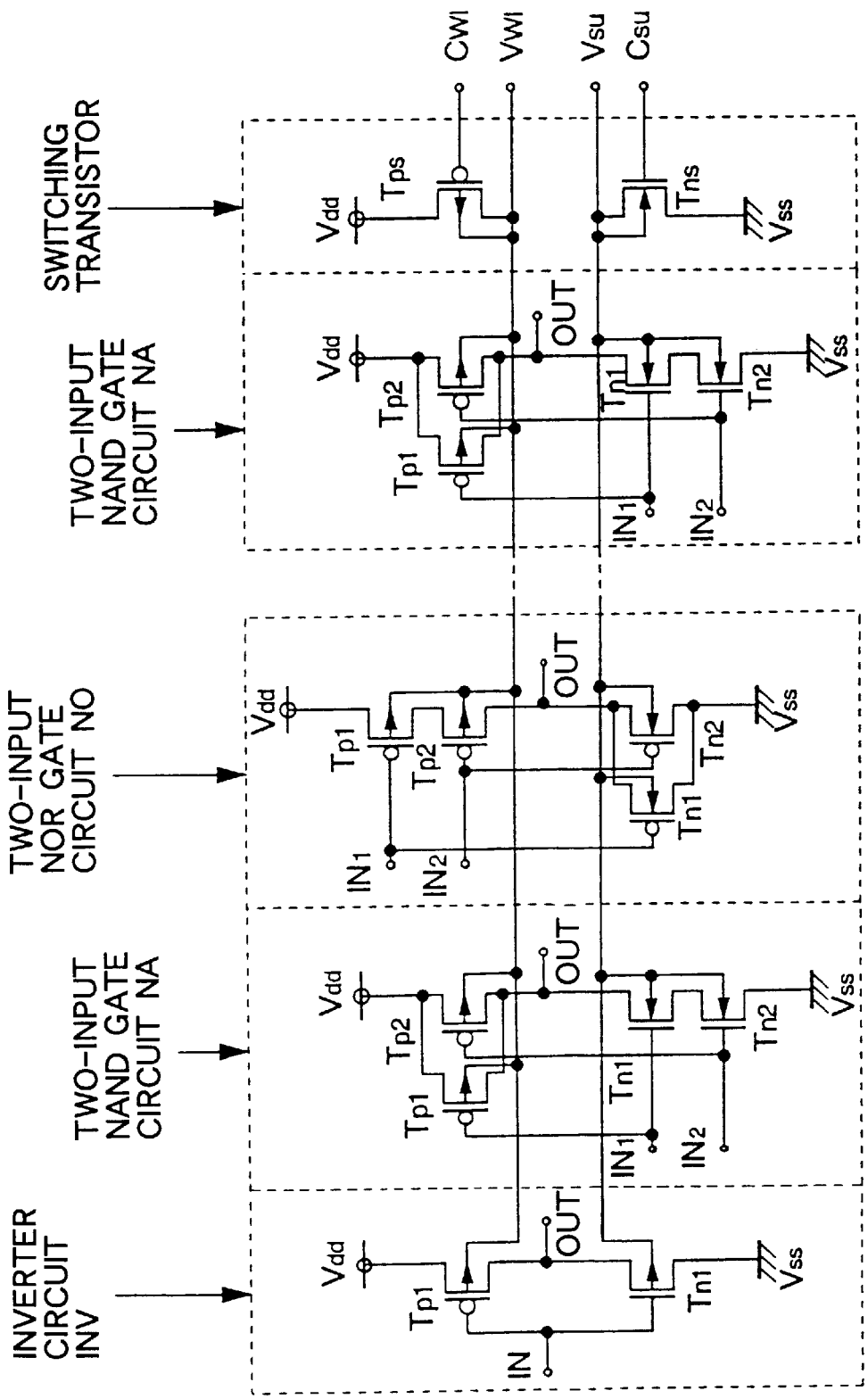
FIG. 20 is a circuit diagram of an essential portion of the semiconductor integrated circuit of the present invention.

Yet another embodiment of the present invention will be described with reference to FIGS. 20 to 25. FIG. 20 shows a circuit diagram of an essential portion of the CMOS semiconductor integrated circuit of this embodiment. In the case of this embodiment, one switching transistor Tps and one switching transistor Tns, as described above, are provided for a plurality of logic gates. FIG. 20 shows an inverter circuit INV, a 2-input NAND gate circuit NA, and a 2-input NOR gate circuit NO as logic gates.

However, the types of logic gates are not restricted to those shown, but can be ones variously modified therefrom. Moreover, a group of logic gates in which one switching transistor is set is not restricted to a group of different types of logic gates, but a group of same types of logic gates can be also used.

The inverter circuit INV is constituted by connecting the transistors Tp1 and Tn1 between the power-supply-voltage lines Vdd and Vss in series. The gate electrodes of the transistors Tp1 and Tn1 are electrically connected to each other and, moreover, are electrically connected with an input line IN.

The 2-input NAND gate circuit NA is constituted by electrically connecting two transistors Tp1 and Tp2, which are connected to each other in parallel, and two transistors Tn1 and Tn2 which are connected to each other in series, between the power-supply-voltage lines Vdd and Vss. The gate electrodes of the transistors Tp1 and Tn1 are electrically connected to each other and, moreover, are electrically connected with an input line IN1. The gate electrodes of the transistors Tp2 and Tn2 are electrically connected to each other and, moreover, are electrically connected with an input line IN2. The drains of the transistors Tp1 and Tp2 are electrically connected with the drain of the transistor Tn1.

The 2-input NOR gate circuit NO is constituted by electrically connecting two transistors Tp1 and Tp2 to each other in series with two transistors Tn1 and Tn2, which are connected to each other in parallel, between the power-supply-voltage lines Vdd and VSS. The gate electrodes of the transistors Tp1 and Tn1 are electrically connected to each other and, moreover, are electrically connected with the input line IN1. The gate electrodes of the transistors Tp2 and Tn2 are electrically connected to each other and, moreover, are electrically connected with the input line IN2. The drain of the transistor Tp2 is electrically connected with the drains of the transistors Tn1 and Tn2.

The substrate potentials of the transistors Tp1, Tp2, Tn1, and Tn2 and the switching transistors Tps and Tns of the inverter circuits INV, the 2-input NAND circuit NA, and 2-input NOR circuit NO are supplied from the well feeding lines Vwl and Vsu. The switching transistor Tps is electrically connected between the well feeding lines Vw1 and the power-supply-voltage line vdd. Moreover, the switching transistor Tns is electrically connected between the well feeding line Vsu and the power-supply-voltage line Vss.

Thus, when testing a semiconductor integrated circuit, it is possible to control the leakage current and thermal runaway due to leakage current by turning off the switching transistors Tps and Tns and supplying a predetermined potential to the well feeding lines Vwl and Vsu. Thereby, it is possible to improve the yield and reliability of semiconductor integrated circuits.

Moreover, in the case of normal operation of a semiconductor integrated circuit, it is possible to prevent the latch-up phenomenon and fluctuation of the operation speed by turning on the switching transistors Tps and Tns and supplying the power supply voltages Vdd and Vss. Therefore, it is possible to secure the operation reliability of a semiconductor integrated circuit.

Figure 21:
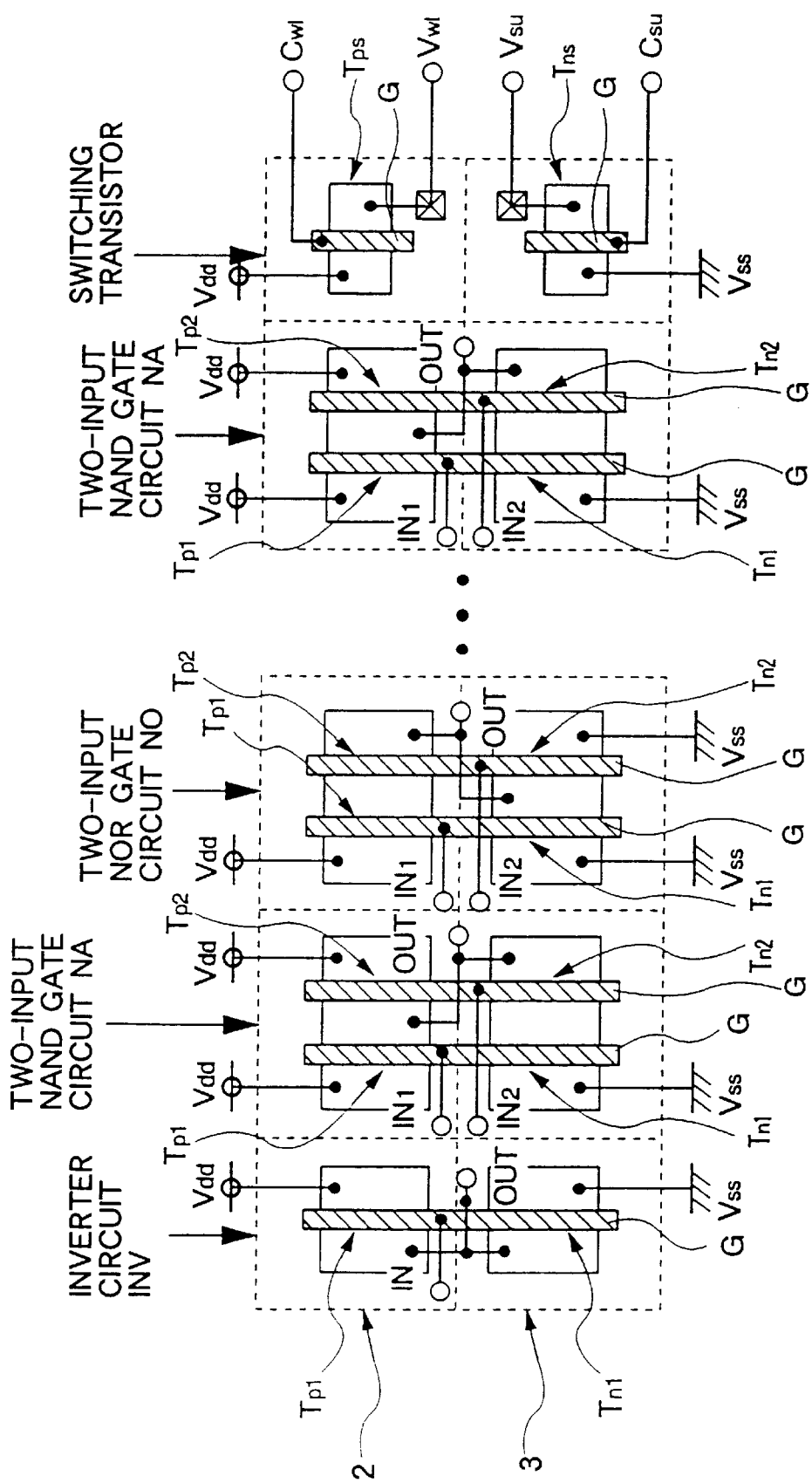
FIG. 21 is a layout diagram showing an example of the layout of the semiconductor integrated circuit in FIG. 20.
Figure 22:
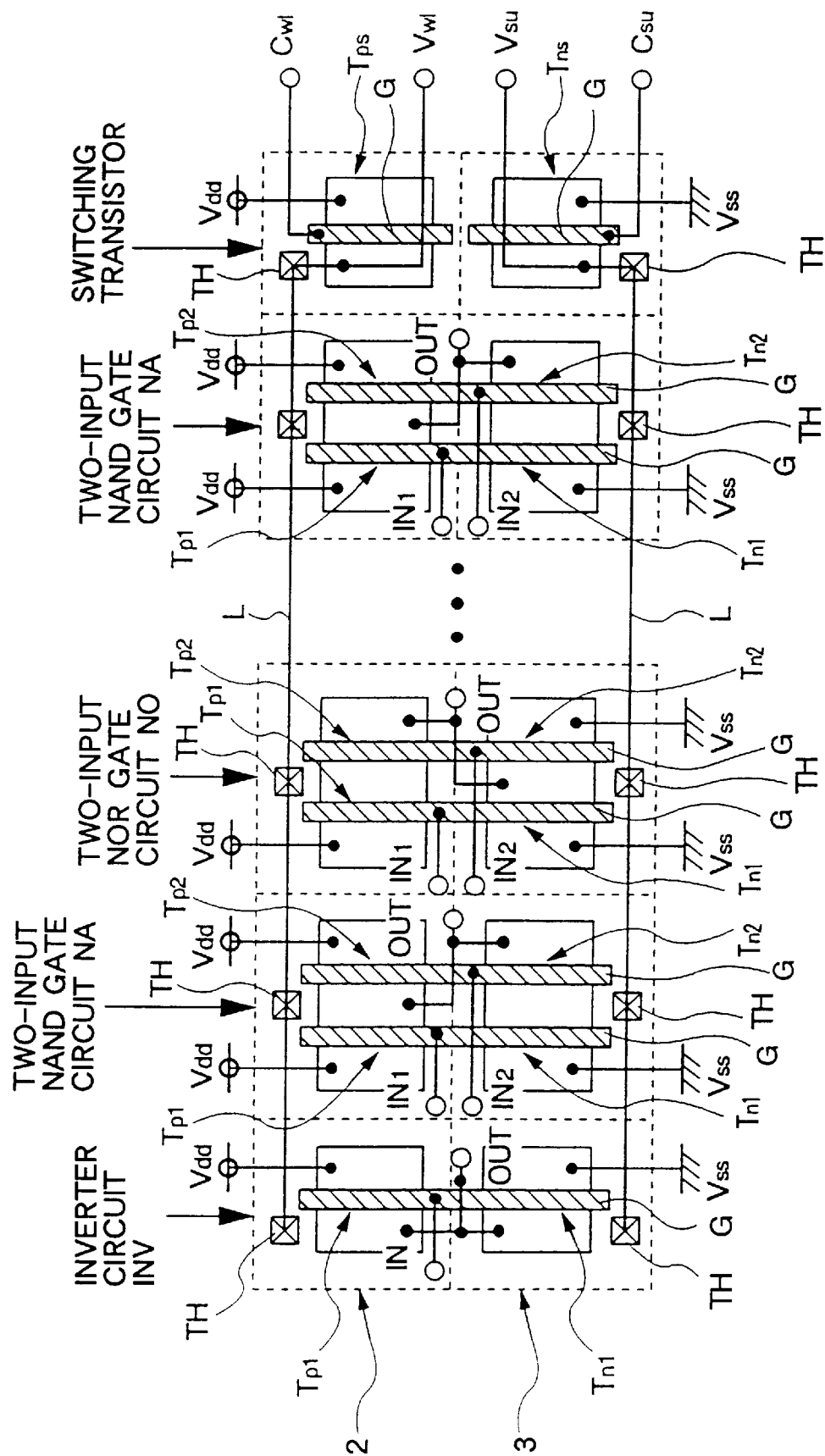
FIG. 22 is a layout diagram showing an example of the layout of the semiconductor integrated circuit in FIG. 20.

FIGS. 21 and 22 show examples of the layout of the circuit shown in FIG. 20.

FIG. 21 shows a case of constituting the well feeding lines Vwl and Vsu with an n-type well 2 and a p-type well 3. That is, FIG. 21 shows a structure for supplying the well feeding voltages Vwl and Vsu to the wells of a plurality of logic gates through the n-type well 2 and the p-type well 3, respectively.

FIG. 22 shows a case in which the well feeding lines Vwl and Vsu are formed with the wiring L. That is, FIG. 22 shows a structure wherein the well feeding voltages VWl and Vsu are supplied to wells of a plurality of logic gates through the wiring L. The wiring L is electrically connected to the n-type well 2 and the p-type well 3 in the cell region CL of each logic gate through a connection hole TH. That is, it is possible to supply the well feeding voltages Vwl and Vsu from the vicinity of each logic gate. Therefore, in the case of the structure in FIG. 22, it is possible to supply the well feeding voltages Vwl and Vsu to each logic gate more stably than the case of the structure shown in FIG. 21.

Figure 23:
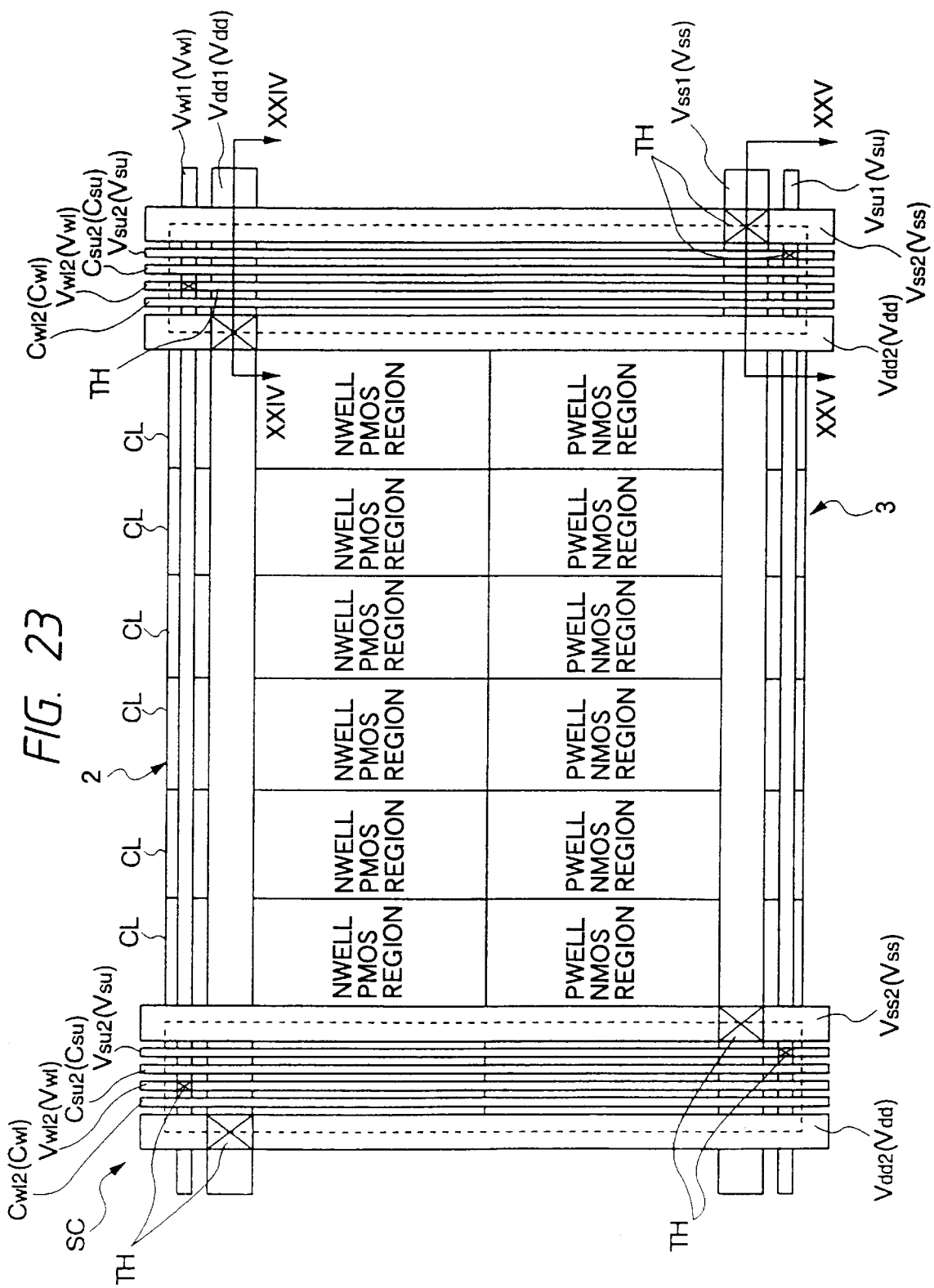
FIG. 23 is a top view of an essential portion of a semiconductor chip of the semiconductor integrated circuit in FIG. 20.
Figure 24:
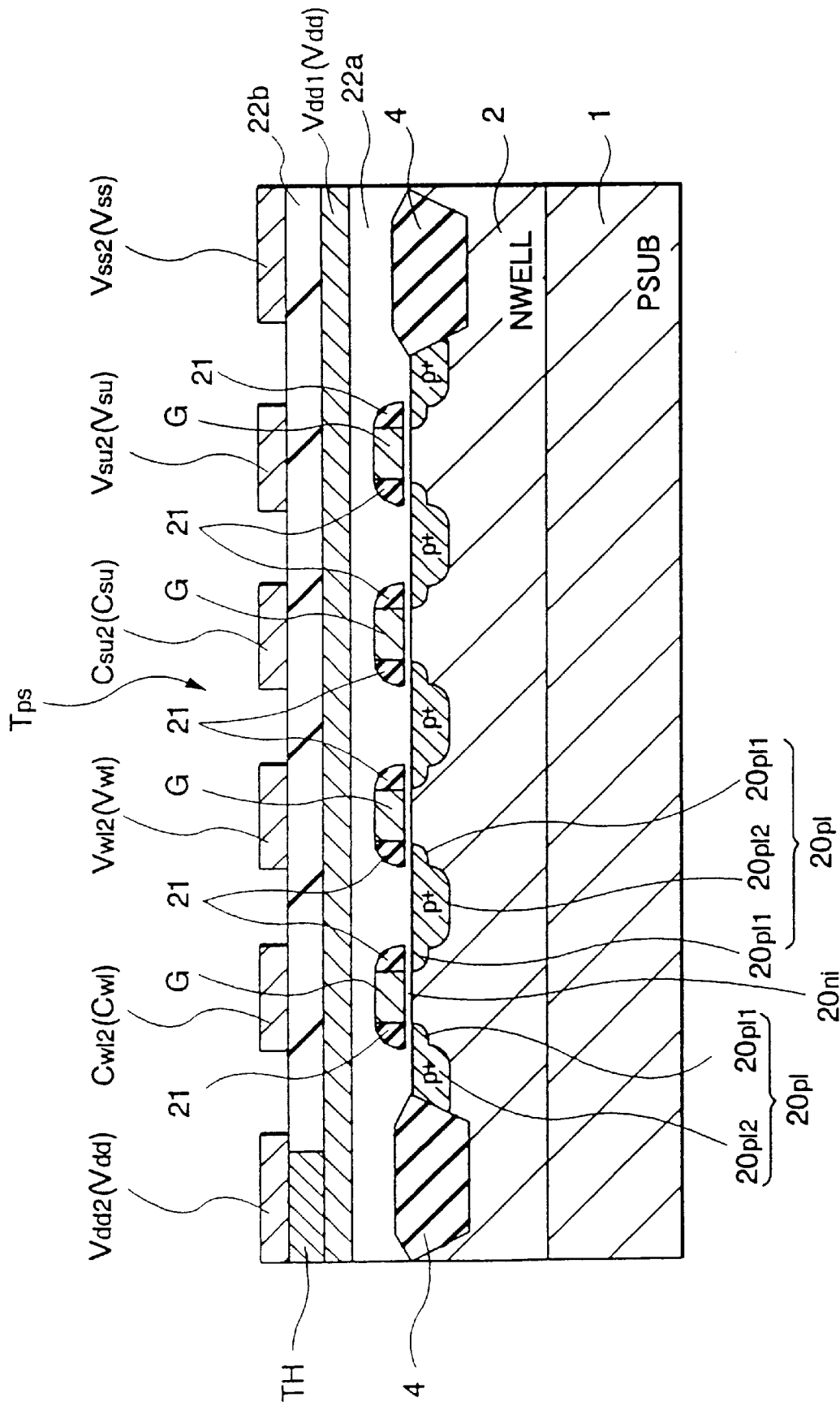
FIG. 24 is a sectional view taken along the line XXIV—XXIV in FIG. 23.
Figure 25:
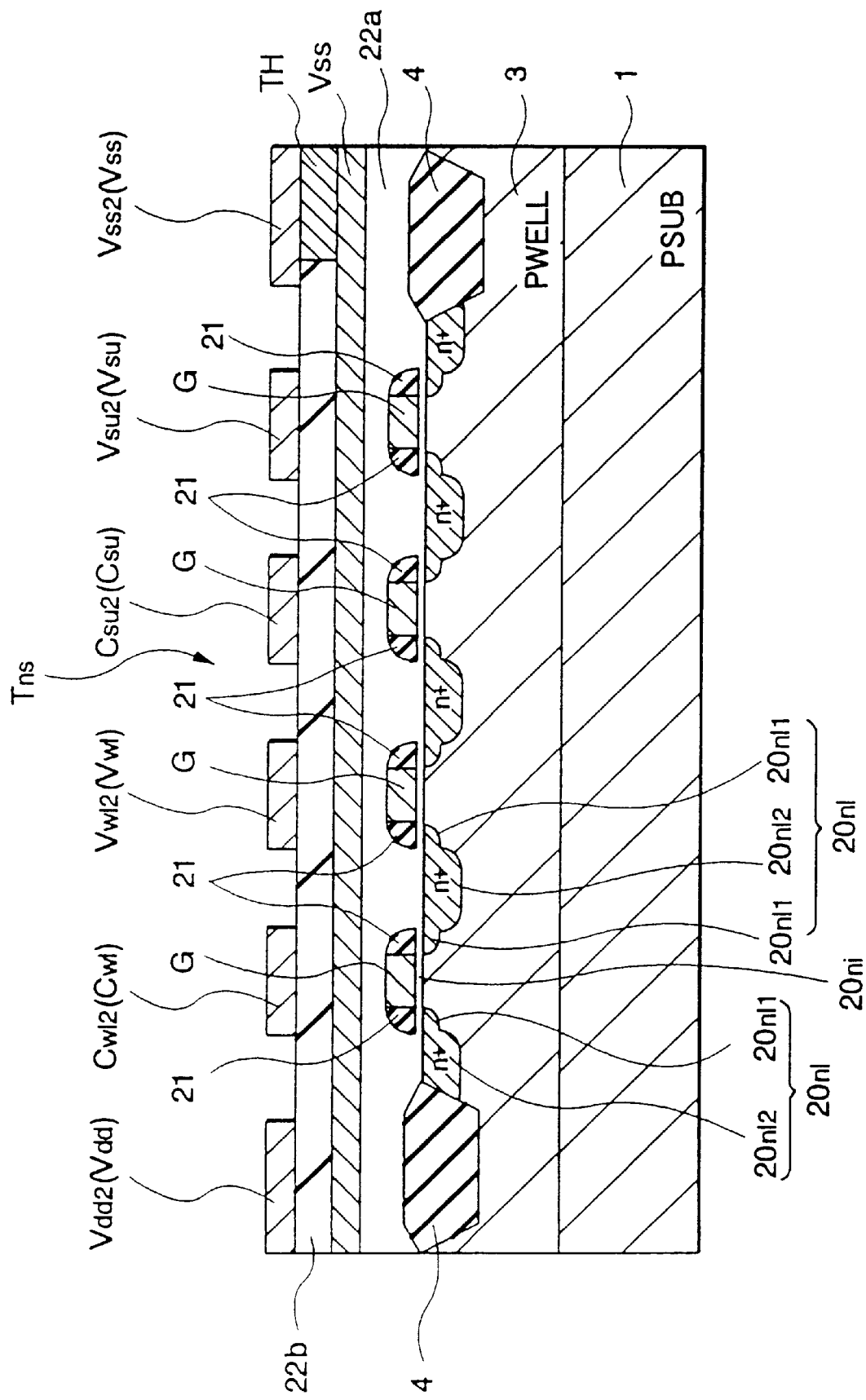
FIG. 25 is a sectional view taken along the line xxv—xxv in FIG. 23.

FIG. 23 is a top view of an essential portion of a semiconductor chip using the structure in FIG. 22. FIG. 24 is a sectional view taken along the line XXIV—XXIV in FIG. 23 and FIG. 25 is a sectional view taken along the line XXV—XXV in FIG. 23. The n-type well 2 and the p-type well 3 are formed on the semiconductor chip SC along the transverse direction of FIG. 23, that is, they extend along the arrangement direction of the cell regions CL.

In FIG. 23, the n-type well 2 and the p-type well 3 are shown as if they are respectively divided into a plurality of wells. However, this view shows the partition of one cell region CL. That is, each of the n-type well 2 and the p-type well 3 is not divided into a plurality of wells, but the wells are electrically connected to each other as one semiconductor region in which predetermined impurity distributions are continued. The cell region CL is a region in which a group of devices required to form a logic gate of the basic unit, and its range is set so as to include the n-type well 2 and the p-type well 3.

Moreover, the power-supply-voltage lines Vdd and Vss and the well feeding lines Vwl and Vsu are arranged on the principal plane of the semiconductor chip SC so as to enclose a group of the above cell regions CL. In the case of the control signal lines Cwl and Csu, however, only those extending in the longitudinal direction of FIG. 23, that is, the direction perpendicular to the arrangement direction of the cell regions CL, are provided.

This is because, in the case of this embodiment, as will be described later, the switching transistors Tps and Tns (see FIG. 20, etc.) are formed immediately below power-supply-voltage lines Vdd2 and Vss2, well feeding lines Vw12 and Vsu2, and control signal lines Cw12 and Csu2 which extend in the direction perpendicular to the arrangement direction of the cell regions CL, and, thereby, it is unnecessary to arrange the control signal lines Cw12 and Csu2 by extending them in the transverse direction of FIG. 23, that is, in the arrangement direction of the cell regions CL. Therefore, in the case of this embodiment, it is possible to decrease the dimension in the longitudinal direction of FIG. 23, that is, the dimension in the longitudinal direction of the cell region CL.

Moreover, the power-supply-voltage lines Vdd and Vss and the well feeding lines Vwl and Vsu are arranged on the principal plane of the semiconductor chip SC like a lattice. FIG. 23 shows the basic unit of the lattice. The power-supply-voltage lines Vddl and a well feeding line Vwll are arranged so as to cross each cell region CL along the arrangement direction of the cell regions CL at the nearby side of the ends (upper side of FIG. 23) of the cell regions CL in their longitudinal direction. Moreover, the power-supply-voltage line vdd1 and the well feeding line Vwll are arranged in order along the direction toward the outer boundary of the cell region CL from the center of it.

The power-supply-voltage line Vssl and the well feeding line Vsul are arranged so as to cross each cell region CL along the arrangement direction of the cell regions CL at the nearby side of the ends (lower side of FIG. 23) of the cell regions CL in their longitudinal direction. Moreover, the power-supply-voltage line Vssl and the well feeding line Vsul are arranged in order in the direction toward the outer boundary of the cell region CL from the center of it. The power-supply-voltage lines Vdd1 and Vssl and the well feeding lines Vwll and Vsul are made of, for example, aluminum or an aluminum alloy and are formed on the first wiring layer.

The power-supply-voltage lines Vdd2 and Vss2, the well feeding lines Vw12 and Vsu2, and the control signal lines Cw12 and Csu12 are arranged so as to be perpendicular to the arrangement direction of the cell regions CL. Moreover, the power-supply-voltage lines Vdd2 and Vss2, the well feeding lines Vw12 and Vsu2, and the control signal lines Cw12 and Csu12 are arranged so that the well feeding lines Vw12 and Vsu2 and the control signal lines Cw12 and Csu12 are disposed between the power-supply-voltage lines Vdd2 and Vss2. The power-supply-voltage lines Vdd2 and Vss2, the well feeding lines Vw12 and Vsu2, and the control signal lines Cw12 and Csu2 are made of, for example, aluminum or an aluminum alloy and are formed on the second wiring layer.

The power-supply-voltage lines Vdd2 and Vss2, the well feeding lines Vw12 and Vsu2, and the control signal lines Cw12 and Csu2 arranged on the second wiring layer are electrically connected through connection holes TH of intersections with the power-supply-voltage lines Vddl and Vssl, well feeding lines Vwll and Vsul, and control signal lines Cwl and Csul.

Thus, in the case of this embodiment, a set of the above switching transistors TpS and Tns are arranged for every one of a plurality of cell regions CL, that is, every one of a plurality of logic gates and, moreover, are arranged immediately below the power-supply-voltage lines Vdd2 and Vss2, the well feeding lines Vw2 and Vsu2, and the control signal lines Cw2 and Csu2. That is, a space in which devices for constituting a semiconductor integrated circuit are not arranged is generally present immediately below the power-supply-voltage lines Vdd2 and Vss2, the well feeding lines Vw12 and Vsu2, and the control signal lines Cw12 and Csu2. Thus, it is possible to effectively use the principal plane of the semiconductor chip SC by providing the switching transistors Tps and Tns in such space.

As a result, it is possible to prevent the area of the chip from increasing compared to the case of providing the switching transistors Tps and Tns for an area other than the above-mentioned space. Moreover, it is possible to decrease the dimension in the longitudinal direction of the cell region CL. Therefore, it is possible to further improve the degree of integration of a device and to further decrease the overall area of the semiconductor chip SC.

FIG. 24 shows a sectional view of a switching transistor Tps having a p-channel MOS FET. The switching transistor Tps is formed in an active region enclosed by a field insulating film 4 in an n-type well 2 and has a semiconductor region 20pl, a gate insulating film 20pi, and a gate electrode G.

The semiconductor region 20pl has a low-concentration region 20pl1 and a high-concentration region 20pl2. The low-concentration region 20pl1 and the high-concentration region 20pl2 contain boron serving as a p-type impurity and the impurity concentration of the high-concentration region 20pl2 is set to a value higher than that of the low-concentration region 20pl1. The gate insulating film 20pi is made of, for example, silicon dioxide (SiO2) and the gate electrode G is formed with a single layer film of low-resistance polysilicon or a laminated film obtained by depositing silicide, such as tungsten silicide, on low-resistance polysilicon.

FIG. 24 shows the gate electrode G divided into a plurality of gate electrodes. In fact, however, these gate electrodes G are electrically connected to each other. A side-wall insulating film 21 made of, for example, SiO2 is formed on the side face of the gate electrode G.

The switching transistor Tps is covered with a layer insulating film 22a. The layer insulating film 22a is made of, for example, SiO2 and a power-supply-voltage line Vdd1 of the first wiring layer is formed on the film 22a. The power-supply-voltage line vdd1 is covered with a layer insulating film 22b. The layer insulating film 22b is made of, for example, SiO2 and power-supply-voltage lines Vdd2 and Vss2, the well feeding lines Vw12 and Vsu2, and the control signal lines Cw12 and Csu2 are formed on the film 22b. Moreover, the third-layer wiring is formed on the upper layer of the lines through a layer insulating film and the third-layer wiring is covered with a surface protection film.

FIG. 25 shows a sectional view of a switching transistor Tns having an n-channel MOS FET. The switching transistor Tns is formed in an active region enclosed by a field insulating film 4 in a p-type well 3 and has a semiconductor region 20nl, gate insulating film 20ni, and gate electrode G.

The semiconductor region 20nl has a low-concentration region 20nl1 and a high-concentration region 20nl2. The low-concentration region 20nl1 and high-concentration region 20nl2 contain, for example, phosphorus or arsenic (As) serving as an n-type impurity, and the impurity concentration of the high-concentration region 20nl2 is set to a value higher than that of the low-concentration region 20nl1. The gate insulating film 20ni is made of, for example, SiO2 and the gate electrode G is formed with, for example, a single layer film of low-resistance polysilicon of a laminated film obtained by depositing silicide, such as tungsten silicide, on low-resistance polysilicon.

FIG. 25 shows the gate electrode G divided into a plurality of electrodes. In fact, however, these gate electrodes G are electrically connected to each other, and a side-wall insulating film 21 made of, for example, SiO2 is formed on the side face of the gate electrode G.

The switching transistor Tns is covered with a layer insulating film 22a. The layer insulating film 22a is made of, for example, SiO2 and a power-supply voltage line Vssl of the first wiring layer is formed on the film 22a. The power-supply-voltage line Vss1 is covered with a layer insulating film 22b. The layer insulating film 22b is made of, for example, SiO2 and power-supply-voltage lines Vdd2 and Vss2, the well feeding lines Vw12 and Vsu2, and the control signal lines Cw12 and Csu2 are formed on the film 22b. The third-layer wiring is formed on the upper layer of the lines through a layer insulating film, and, moreover, the third-layer wiring is covered with a surface protection film.

Thus, this embodiment makes it possible to obtain the following advantages in addition to the advantages obtained from the preceding embodiment described with reference to FIG. 1 and the like.

(1) It is possible to decrease the overall area occupied by switching transistors TpS and Tns in a semiconductor chip SC by arranging a set of switching transistors Tps and Tns for a plurality of logic gates.

(2) Because the switching transistors Tps and Tns are set immediately below the wiring arrangement region of power-supply-voltage lines Vdd2 and Vss2, it is possible to effectively use the principal plane of the semiconductor chip SC and prevent the area from increasing compared to the case of setting the switching transistors Tps and Tns in a region other than the wiring arrangement region.

(3) Because the switching transistors Tps and Tns are set immediately below the wiring arrangement region of the power-supply-voltage lines Vdd2 and Vss2, it is unnecessary to set control signal lines Cwl and Csu extending in the arrangement direction of cell regions CL. Therefore, it is possible to decrease the area in the longitudinal direction of the cell region CL by a value equivalent to the area occupied by the control signal lines Cwl and Csu.

(4) According to the above Items (1) to (3), it is possible to prevent the chip size from increasing due to addition of the switching transistors Tps and Tns.

(5) According to the above Items (1) to (3), it is possible to prevent the degree of integration of an integrated circuit device from lowering due to addition of the switching transistors Tps and Tns.

Figure 26:
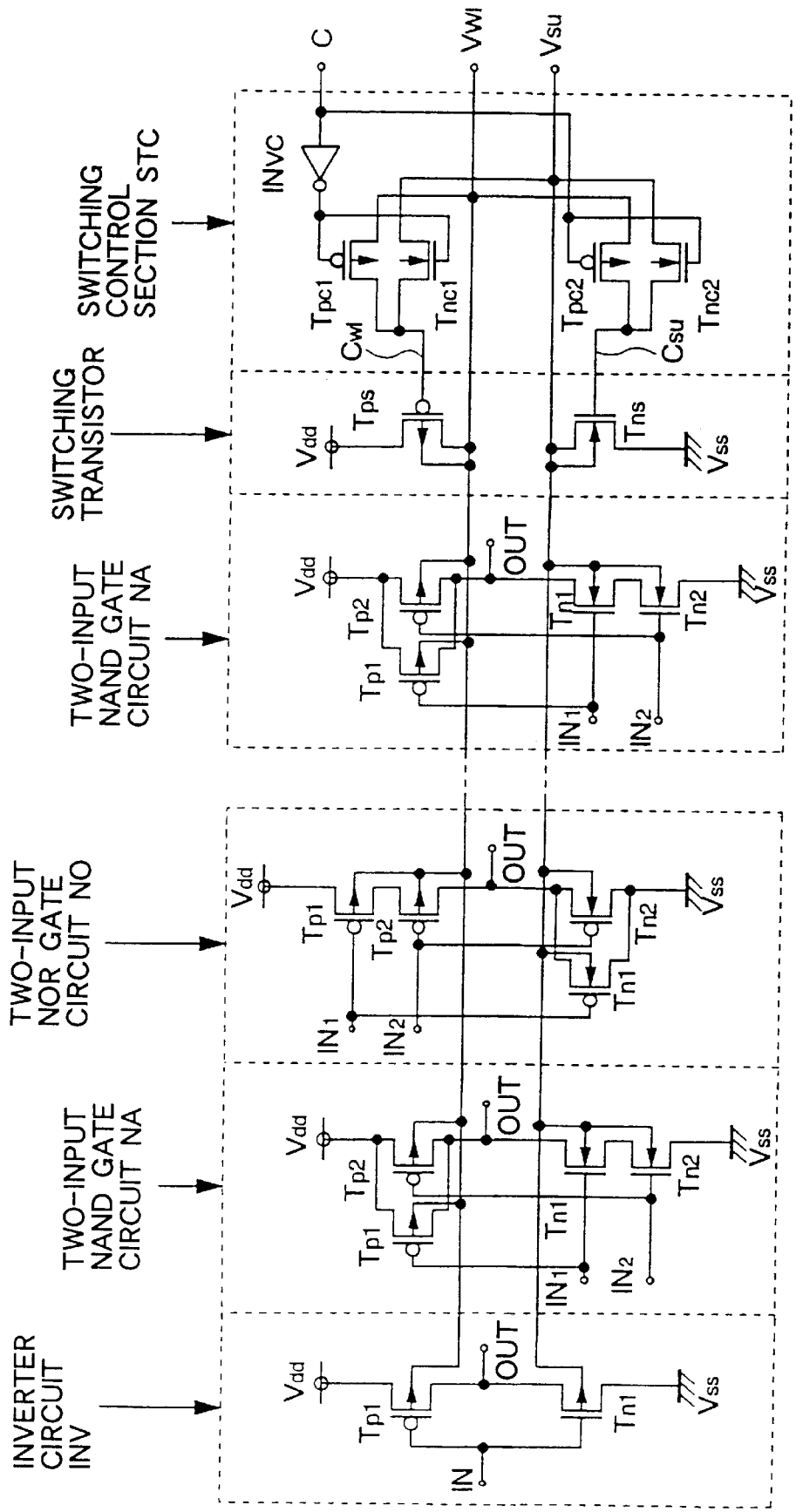
FIG. 26 is a circuit diagram of an essential portion of a semiconductor integrated circuit of still another embodiment of the present invention.

Now, still another embodiment of the present invention will be described with reference to FIG. 26. FIG. 26 shows a circuit diagram of an essential portion of the semiconductor integrated circuit of this embodiment of the present invention.

This embodiment has a structure which is almost the same as the preceding embodiment, except that a switching control section STC for controlling operations of the switching transistors Tps and Tns is set at the front stage of the switching transistors Tps and Tns. Because the switching control section STC is used, this embodiment makes it possible to turn on/off the switching transistors Tps and Tns by only one control-signal wiring. This structure is-realized by considering that, when either of the control signal lines Cwl and Csu is set to a high potential (High), the other one is set to a low potential (Low) and is constituted as shown below.

The switching control section STC has transistors Tpc1, Tpc2, Tnc1, and Tnc2 and an inverter circuit INVc. The transistors Tpc1 and TpC2 respectively have a p-channel MOS FET and the transistors Tnc1 and Tnc2 respectively have an n-channel MOS FET. A control signal line C is electrically connected to the gate electrodes of the transistors Tpc1 and Tnc1 through the inverter circuit INVc and, moreover, is electrically directly connected to the gate electrodes of the transistors Tpc2 and Tnc2.

This embodiment is constituted by dividing the control signal line C into two wiring paths and electrically connecting one of the wiring paths with a rear-stage circuit through the inverter circuit INVc and electrically directly connecting the other of them with the rear-stage circuit. Thereby, this embodiment is constituted so as to generate two control signals different in potential from one control signal and to transmit the two signals of different potential to the switching transistors Tps and Tns as control signals Cwl and Csu.

One of the semiconductor regions of each of the transistors Tpc1 and Tnc1 is electrically connected to the gate electrode of the switching transistor Tps. Moreover, the other semiconductor region of the transistor Tpcl is electrically connected with a well feeding line Vwl and the other semiconductor region of the transistor Tnc1 is electrically connected with a well feeding line Vsu.

One of the semiconductor regions of the transistors Tpc2 and Tnc2 are electrically connected to the gate electrode of the switching transistor Tns. Moreover, the other semiconductor region of the transistor Tpc2 is electrically connected with the well feeding line VW1 and the other semiconductor region of the transistor Tnc2 is electrically connected with the well feeding line Vsu.

Thus, this embodiment makes it possible to obtain the following advantage in addition to the advantages obtained from the preceding embodiment described with reference to FIG. 20 and the like. That is, this embodiment makes it possible to turn on/off the switching transistors Tps and Tns using only one control signal line.

Another embodiment of the present invention will be described with reference to FIGS. 27 and 28. In the case of this embodiment, the present invention is applied to an SPAM (Static Random Access Memory) or the like built in a computer, such as a desk-top or lap-top personal computer.

Figure 27:
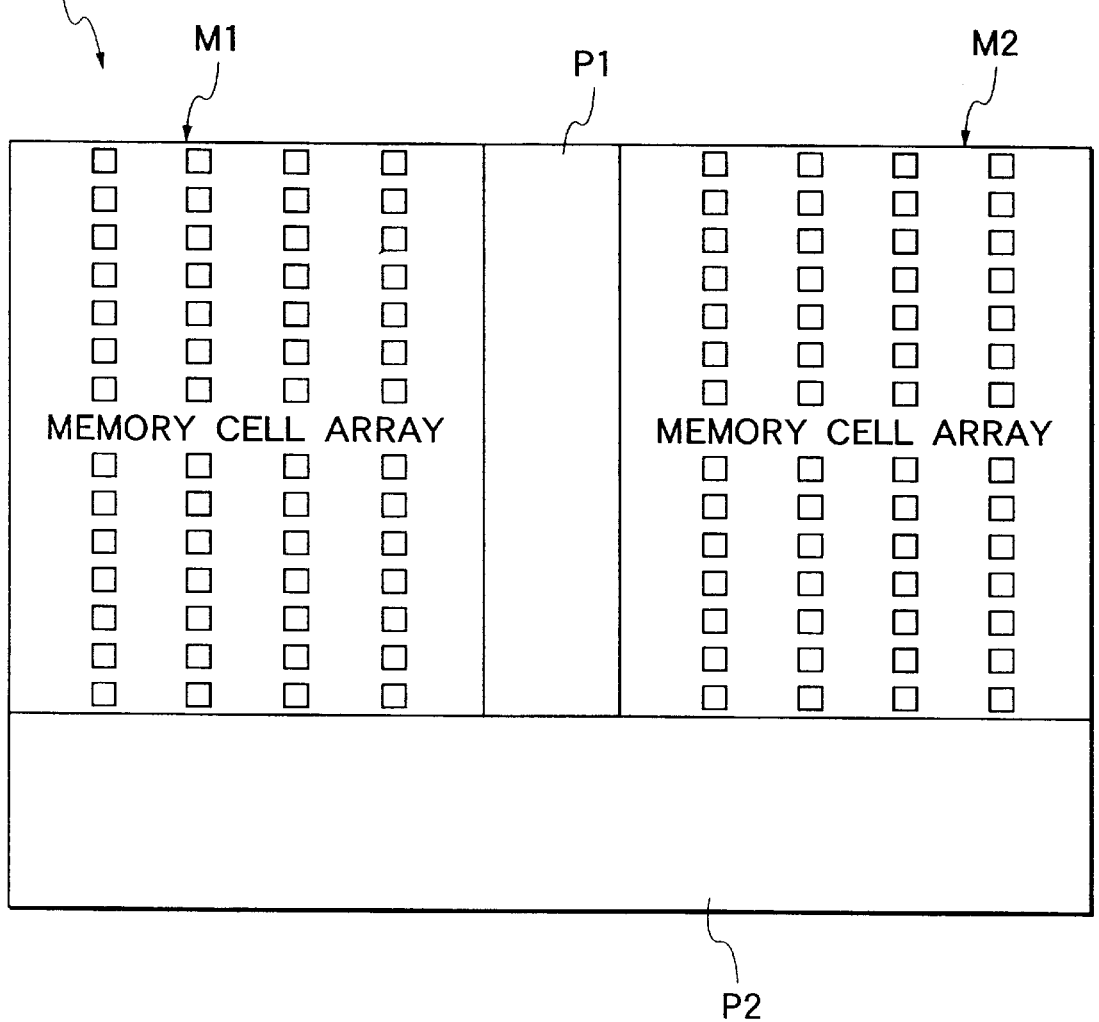
FIG. 27 is a top view of the semiconductor chip of a semiconductor integrated circuit of still another embodiment of the present invention.

FIG. 27 is a top view of a semiconductor chip SC having an SRAM. Peripheral circuit regions P1 and P2 are arranged at the center of a semiconductor chip SC and at the vicinity of one major side (lower major side in FIG. 27) of the chip SC. A peripheral circuit, such as a decoder circuit, is formed in the central peripheral-circuit region P1. Moreover, a peripheral circuit, such as a sense amplifier circuit or write circuit, is formed in the peripheral circuit region P2 nearby the major side.

The switching transistors Tps and Tns (see FIG. 20, etc.) are also arranged in the peripheral circuit regions P1 and P2 similar to the case of the preceding embodiment. It is possible to arrange one switching transistor for every logic gate or one switching transistor for every two or more logic gates. Therefore, it is also possible to obtain the advantages obtained from the preceding embodiment from peripheral circuits of a semiconductor integrated circuit. Moreover, in the case of the semiconductor chip SC, memory cell arrays M1 and M2 are arranged at both sides of the central peripheral-circuit region P1. A plurality of memory cells in each of arrays M1 and M2, to be mentioned later, are regularly arranged in the vertical and horizontal directions in FIG. 27.

In the case of this embodiment, the switching transistors are also arranged in the memory cell arrays M1 and M2. The switching transistors are shown by a plurality of black quadrangles regularly arranged in the memory cell arrays M1 and M2. However, it is not required to set a plurality of the switching transistors in each of the memory cell arrays M1 and M2. In this regard, it is possible to set one switching transistor in each of the memory cell arrays M1 and M2. Moreover, the manner of arranging switching transistors is not restricted to arranging the switching transistors in the vertical and horizontal directions in FIG. 27. It is also possible to arrange switching transistors only in the vertical or horizontal direction in FIG. 27.

Figure 28:
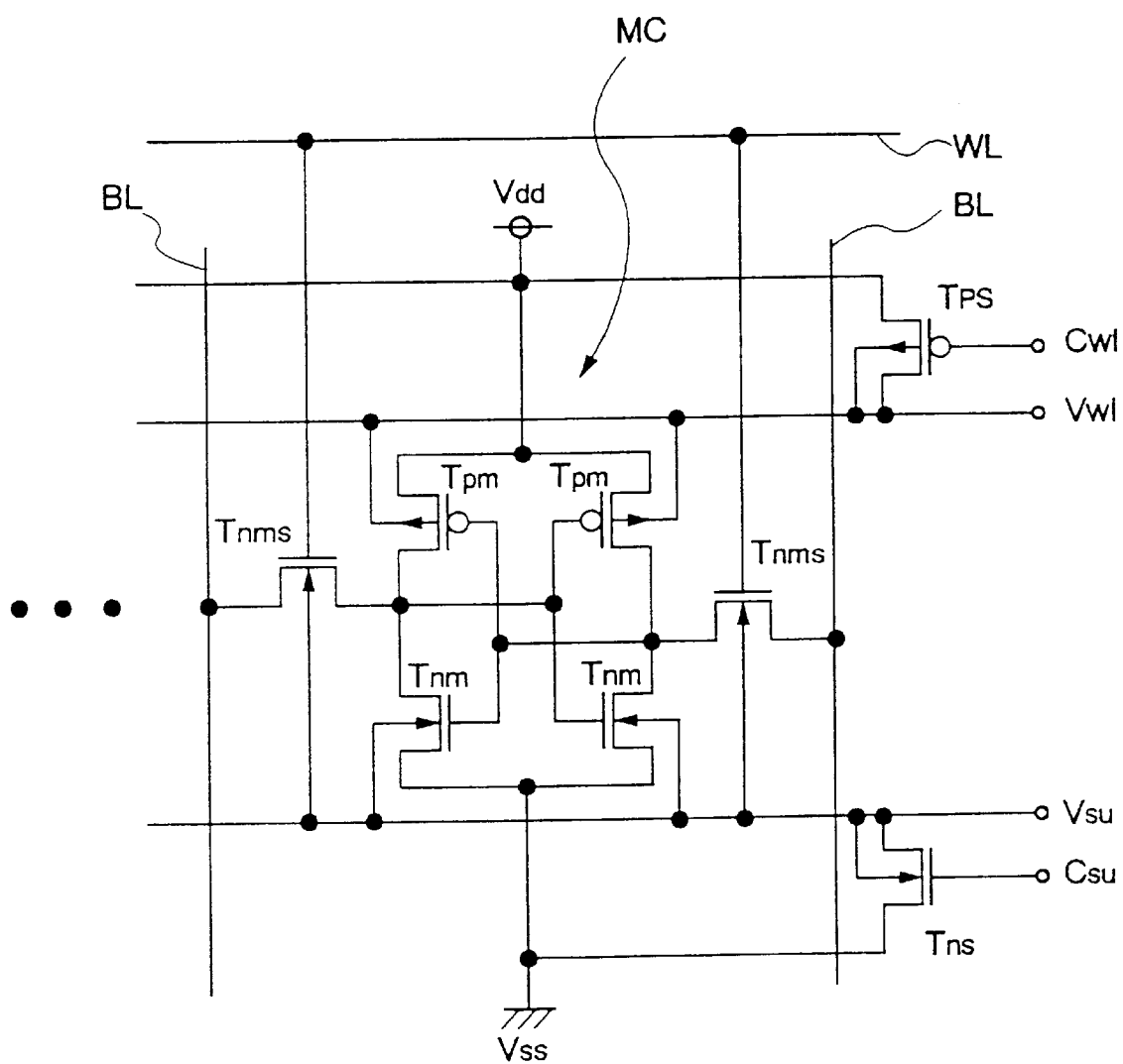
FIG. 28 is a circuit diagram of a memory cell of the semiconductor integrated circuit in FIG. 27.
Figure 29:
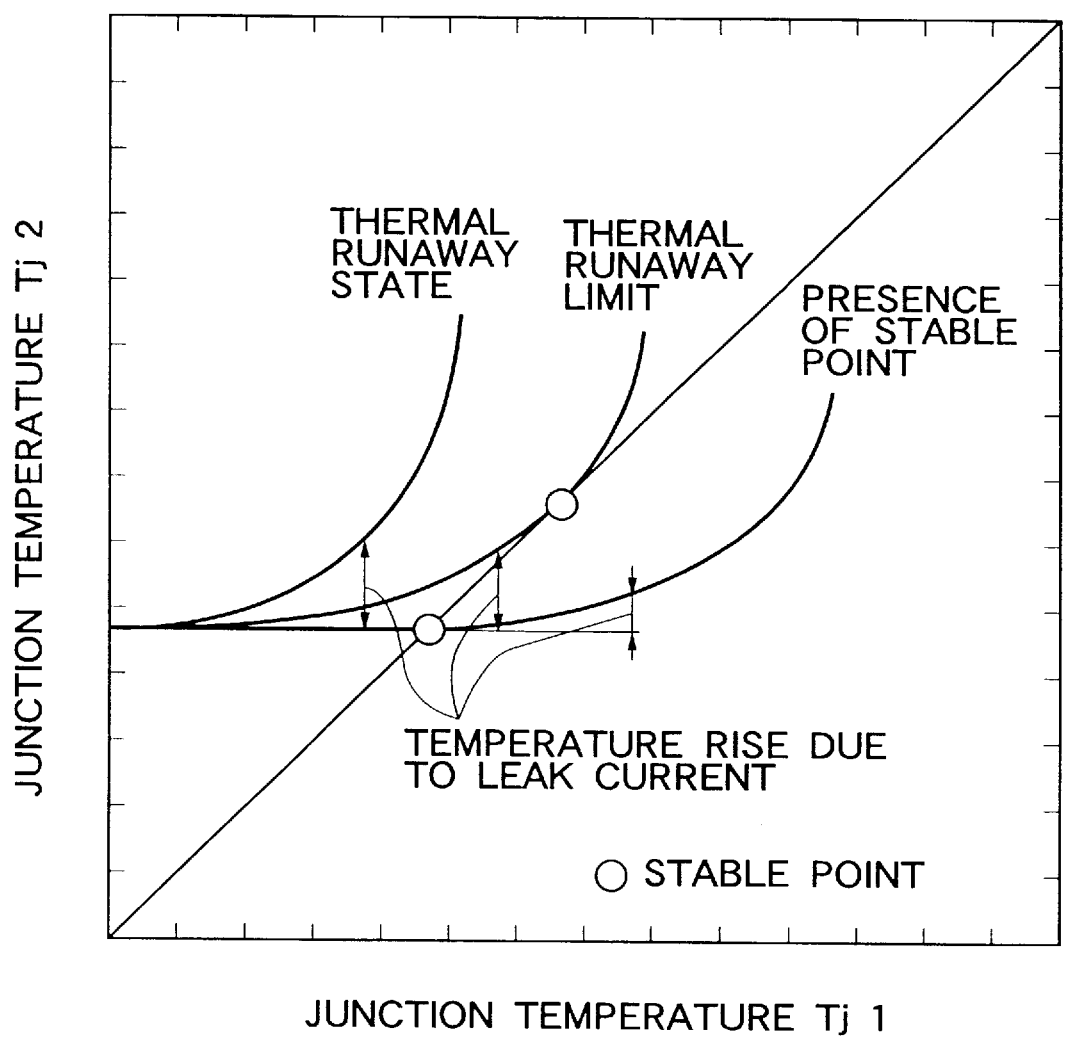
FIG. 29 is a graphic diagram for explaining the mechanism of thermal runaway under an aging test.

FIG. 28 shows a memory cell MC of the SRAM. The memory cell MC is constituted on the basis of, for example, a flip flop circuit obtained by making two-stage inverters having a CMOS structure intersect each other and connecting them to each other and disposing them nearby the intersection between a word line WL and a bit line BL. Each inverter has transistors Tpm and Tnm and is constituted so that the input and the output of one inverter are electrically connected to the output and the input of the other inverter respectively. Moreover, the transistor Tpm is a p-channel MOS FET and the transistor Tnm is an n-channel MOS FET.

The memory cell MC is electrically connected with a bit line BL through a transistor Tnms. The transistor Tnms is, for example, an n-channel MOS FET and its gate electrode is electrically connected with a word line WL. A plurality of memory cells MC of this type are regularly arranged on a memory cell array. This embodiment has a structure capable of controlling the substrate potentials of the transistors Tpm and Tnm and the substrate potential of the transistor Tnms in the memory cell MC from the outside of the memory cell MC. That is, the structure is constituted as described below.

Well feeding lines Vw1 and Vsu extending in parallel with a word line WL are formed on the memory cell arrays M1 and M2 (see FIG. 27) so as to hold the memory cell MC. The well feeding lines Vw1 and Vsu are electrically connected with the wells of the transistors Tpm, Tnm, and Tnms of the memory cell MC and are electrically connected with power-supply-voltage lines Vdd and Vss, respectively, through the switching transistors Tps and Tns.

In the case of this embodiment, one switching transistor Tps and one switching transistor Tns are arranged on a plurality of memory cells MC. Thereby, it is possible to prevent the chip size from greatly increasing because of providing the memory cell arrays M1 and M2 with the switching transistors Tps and Tns. Moreover, it is possible to connect the well feeding lines Vwl and Vsu with the well of each of the transistors Tpm, Tnm, and Tnms through a well or through a wiring as shown in FIG. 21 or 22.

In the case of this type of embodiment, when testing a semiconductor integrated circuit, the switching transistors Tps and Tns in the memory cell arrays M1 and M2 are turned off and a predetermined voltage is applied to the substrate potentials of the transistors Tpm and Tnm, and Tnms from the well feeding lines Vwl and Vsu. Thereby, it is possible to avoid the problem of leakage current during a test, and moreover avoid the problem of thermal runaway due to the leakage current during an aging test.

Moreover, under the normal operation of a semiconductor integrated circuit, the switching transistors Tps and Tns are turned on by applying the power supply voltages Vss and Vdd to the control signal lines Cwl and Csu, respectively. Thereby, it is possible to control fluctuation of the substrate potentials of the transistors Tpm, Tnm, and Tnms, thereby preventing the latch-up phenomenon and fluctuation of the operation speed due to fluctuation of the substrate potentials, thereby securing the operation reliability of the semiconductor integrated circuit.

The present invention is specifically described above in accordance with various embodiments. However, the present invention is not restricted to such embodiments. It is needless to say that various modifications can be made as long as they do not deviate from the gist of the present invention.

For example, it is possible to use a semiconductor substrate having a so-called SOI (Silicon on Insulator) structure in which a thin semiconductor layer for forming a device is formed on an insulating layer and to realize a semiconductor integrated circuit having a circuit in which various semiconductor devices, such as a MOS FET and a bipolar transistor, are combined outside of a region for forming a CMOS FET.

In the above description, by way of example, the invention is applied to a logic gate circuit or a semiconductor integrated circuit of a single semiconductor memory circuit, which is one application of invention. However, it is also possible to apply the present invention to a semiconductor integrated circuit having a logic gate circuit and a semiconductor memory circuit on the same semiconductor substrate, such as a one-chip microcomputer. Moreover, it is possible to apply the present invention to at least a semiconductor integrated circuit having a CMIS (Complementary Metal Insulator Semiconductor) structure.

As described above, a semiconductor integrated circuit of the present invention is preferably in a mobile electronic unit, a small electronic unit such as a video camera, or a desk-top or lap-top personal computer.

What is claimed is:

1. A semiconductor integrated circuit comprising:
    a CMOS FET circuit including a second-conductivity-type MOS FET in a first-conductivity-type well formed over a semiconductor substrate and a first-conductivity-type MOS FET in a second-conductivity-type well formed over the substrate;
    a first power-supply-voltage line electrically connected to the CMOS FET circuit;
    a second power-supply-voltage line to which a voltage lower than that of the first power-supply-voltage line is applied is electrically connected to the CMOS FET circuit;
    a third power-supply-voltage line provided to supply selectively power to the first-conductivity-type well;
    a fourth power-supply-voltage line provided to supply selectively power to the second-conductivity-type well, wherein the third power-supply-voltage line and the fourth power-supply-voltage line are provided independently of the first power-supply-voltage line and of the second power-supply-voltage line, respectively;
    a first switching transistor comprising a MOS FET being electrically connected between the first power-supply-voltage line and the third power-supply-voltage line; and
    a second switching transistor comprising a MOS FET being electrically connected between the second power-supply voltage line and the fourth power-supply-voltage line,
        wherein the first and third power-supply-voltage lines become short-circuited through selectively actuating the first switching transistor, and the second and fourth power-supply-voltage lines become short-circuited through selectively actuating the second switching transistor,
        wherein a set including the first and second switching transistors is provided for a plurality of logic gates, the plurality of logic gates are provided in a plurality of cell regions, respectively, and at least one of which includes the CMOS FET circuit,
        wherein each of the third power-supply-voltage line and the fourth power-supply-voltage line is formed of a separate conductor wiring, and
        wherein a connective portion for connecting the conductor wiring for the third power-supply-voltage line with the first-conductivity-type well and another connective portion for connecting the conductor wiring for the fourth power-supply-voltage line with the second-conductivity-type well are provided for each of the cell regions.

2. A semiconductor integrated circuit according to claim 1,
    wherein the first power-supply-voltage line is electrically connected to the source of the second-conductivity-type MOS FET, the second power-supply-voltage line is electrically connected to the source of the second-conductivity-type MOS FET, the drains of the first and second conductivity-type MOS FETs are mutually connected to an output terminal, and the gates of which are connected to an input terminal, and
    wherein the MOS FET of the first switching transistor has the second conductivity type and is provided in the first-conductivity-type well, and the MOS FET of the second switching transistor has the first conductivity type and is provided in the second-conductivity-type well, the source-drain path of the first switching transistor MOS FET is connected between the first and third power-supply-voltage lines, the source-drain path of the second switching transistor MOS FET is connected between the second and fourth power-supply voltage lines, and the first and second switching transistor MOS FETs are set, in response to application of gate control signals thereat, in a conducting state when in a normal operation of the semiconductor integrated circuit and are set in a non-conducting state when in a testing operation of the same.

3. A semiconductor integrated circuit according to claim 2, wherein each of the plurality of cell regions is associated with a CMOS FET logic circuit for performing a single or multi-input inverting logic operation.

4. A semiconductor integrated circuit according to claim 3, wherein each CMOS FET logic circuit has equal numbers of first and second conductivity-type MOS FETs, the second-conductivity-type MOS FETs associated with all of the cell regions being commonly formed in the first-conductivity-type well, and the first-conductivity-type MOS FETs associated with all of the cell regions being commonly formed in the second-conductivity-type well.

5. A semiconductor integrated circuit according to claim 1, wherein each of the plurality of cell regions is associated with a CMOS FET logic circuit for performing a single or multi-input inverting logic operation.

6. A semiconductor integrated circuit according to claim 5, wherein each CMOS FET logic circuit has equal numbers of first and second conductivity-type MOS FETs, the second-conductivity-type MOS FETs associated with all of the cell regions being commonly formed in the first-conductivity-type well, and the first-conductivity-type MOS FETs associated with all of the cell regions being commonly formed in the second-conductivity-type well.

7. A semiconductor integrated circuit comprising:
    a CMOS FET circuit including a second-conductivity-type MOS FET in a first-conductivity-type well formed over a semiconductor substrate and a first-conductivity-type MOS FET in a second-conductivity-type well formed over the substrate;
    a first power-supply-voltage line electrically connected to the CMOS FET circuit;

a second power-supply-voltage line to which a voltage lower than that of the first power-supply-voltage line is applied is electrically connected to the CMOS FET circuit;

a third power-supply-voltage line provided to supply selectively power to the first-conductivity-type well;

a fourth power-supply-voltage line provided to supply selectively power to the second-conductivity-type well, wherein the third power-supply-voltage line and the fourth power-supply-voltage line are provided independently of the first power-supply-voltage line and of the second power-supply-voltage line, respectively;

a first switching transistor comprising a MOS FET being electrically connected between the first power-supply-voltage line and the third power-supply-voltage line; and a second switching transistor comprising a MOS FET being electrically connected between the second power-supply-voltage line and the fourth power-supply-voltage line, wherein the first and third power-supply-voltage lines become short-circuited through selectively actuating the first switching transistor, and the second and fourth power-supply-voltage lines become short-circuited through selectively actuating the second switching transistor, and wherein the first switching transistor and the second switching transistor are provided at a location covering a part of a principal plane of the substrate where power-supply-voltage lines are arranged.

8. A semiconductor integrated circuit according to claim 7, wherein the integrated circuit is provided in a semiconductor chip and the power-supply-voltage lines are arranged over the principal plane of the semiconductor chip like a lattice.

9. A semiconductor integrated circuit according to claim 8, wherein the first switching transistor and the second switching transistor are provided for an intersectional region between the line of a plurality of cell regions arranged over the semiconductor chip and a power-supply-voltage line extending so as to intersect therewith in the arrangement direction of the cell regions.

10. A semiconductor integrated circuit device having, at a principal plane of a semiconductor substrate thereof, a layout arrangement comprising:

power supply voltage lines being disposed as clusters of conductive lines arranged as a lattice;

at least one group of cell regions each group being assigned to a different location on the lattice and including a series arrangement of plural cell regions, each cell region having a first transistor portion formed at an n-type region and a second transistor portion, operatively coupled thereto, formed at a p-type well region, wherein the first and second transistor portions of each cell are rectangular shaped, a first of a pair of opposing transverse sides of the first transistor portion of each cell region adjoining a first of a pair of opposing transverse sides of the second transistor portion of that cell region, and a pair of opposing longitudinal sides of each of the first and second transistor portions being for adjoining thereto other ones of the first and second transistor portions of the group of plural cell regions, respectively, wherein the transverse and longitudinal sides of the first and second transistor portions are substantially parallel to a first and an orthogonal, second direction associated with the lattice, respectively, wherein in at least one location of the lattice, there is included a group of said series arranged cell regions, a first cluster of conductive lines extended in the second direction of the lattice and disposed between adjacent groups of cell regions in the first direction, and intersecting therewith second and third clusters of conductive lines extended in the first direction and disposed near the second of the pair of transverse sides of the first and second transistor portions of the cell regions of the group, respectively, and (i) the first group of conductive lines having at least first and second lines for supplying a first voltage and a second, lower voltage, and third and fourth lines for supplying power to the n-type and p-type regions, respectively;

(ii) the second group of conductive lines having the first and third lines of at least four additional lines amongst the second and third clusters, the first line thereof being electrically connected to the first line of the first group of conductive lines and to power terminals of the first transistor portions of the group of cell regions, and the third line being electrically connected to the third line of the first group of conductive lines and to the n-type region; and (iii) the third group of conductive lines having the second and fourth of the additional lines, the second line being electrically connected to the second line of the first group of conductive lines and to power terminals of the second transistor portions of the group, and a fourth line electrically connected to the fourth line of the first group of conductive lines and to the p-type region; and at least one switching set including a first switching transistor comprising a MISFET having a source-drain path coupled between the first and third lines of one of the first and second groups of lines and a gate coupled to receive a control signal, and a second switching transistor comprising a MISFET having a source-drain path coupled between the second and fourth lines of that group of conductive lines having the first and third lines thereof coupled to the first switching transistor and having a gate coupled to receive a control signal, wherein the first and third conductive lines and the second and fourth conductive lines become short-circuited in a first mode of the circuit in which the first and second switching transistors are turned on, and in a second mode of the circuit the first and second switching transistors are turned off, respectively, and wherein the first and second switching transistors are located at a part of the principal plane of the substrate where the power-supply-voltage lines are disposed.

11. A semiconductor integrated circuit device according to claim 10, wherein each first transistor portion is a p-channel MISFET portion having at least one p-channel MISFET and each second transistor portion is an n-channel MISFET portion having at least one n-channel MISFET coupled to said at least one p-channel MISFET, and wherein at least one of the plural cell regions is configured as a complementary MISFET logic circuit for performing an inverting logic operation.

12. A semiconductor integrated circuit device according to claim 11, wherein the n-type region and the p-type region include a common n-type well for the p-channel MISFET portions and a common p-type well for the n-channel MISFET portions associated with each group of plural cell regions, respectively.

13. A semiconductor integrated circuit device according to claim 12, wherein said at least one switching set includes a single said switching set provided for each group having a series arrangement of plural cell regions.

14. A semiconductor integrated circuit device according to claim 13, wherein the first switching transistor includes a p-channel MISFET, formed at a part of the n-type well located beneath the first cluster of conductive lines, having a drain coupled to the first line and a source coupled to the third line of the first cluster, and having a gate coupled to a fifth line of the first cluster, and the second switching transistor includes a p-channel MISFET, formed at a part of the p-type well located beneath the first cluster of conductive lines, having a drain coupled to the second line and a source coupled to the fourth line of the first cluster, and having a gate coupled to a sixth line of the first cluster, the fifth and sixth lines are for supplying the control signals.

15. A semiconductor integrated circuit device according to claim 12,
wherein the third line of the second cluster of conductive lines is electrically connected at locations of the n-type well at each of the plural cell regions and the fourth line of the third cluster of conductive lines is electrically connected at locations of the p-type well at each of the plural cell regions.

16. A semiconductor integrated circuit device according to claim 12, wherein said at least one switching set includes a respective said switching set provided at each of the plural cells of the group, each switching set including a p-channel MISFET located at the n-type well near the second of the pair of transverse sides of the p-channel MISFET portion thereof and beneath the second cluster of conductive lines, and an n-channel MISFET located at the p-type well near the second of the pair of transverse sides of the n-channel MISFET portion thereof and beneath the third cluster of conductive lines, each set of p-channel and n-channel MISFETs having gates thereof coupled to additional fifth and sixth lines included in the second and third clusters of conductive lines, respectively, for supplying thereto control signals, and
wherein the first cluster of conductive lines further includes fifth and sixth lines, coupled to the fifth and sixth lines of the second and third clusters and supplying first and second control signals, respectively.

17. A semiconductor integrated circuit device according to claim 16, wherein the first cluster of conductive lines corresponds to a different level wiring layer than that of the second and first clusters of conductive lines.

18. A semiconductor integrated circuit device according to claim 17, wherein the first cluster is formed at a vertically higher level wiring layer than that of the first and second clusters, the second and third clusters of conductive lines correspond to same level wiring layers.

19. A semiconductor integrated circuit device according to claim 14, wherein the first cluster of conductive lines corresponds to a different level wiring layer than that of the second and first clusters of conductive lines.

20. A semiconductor integrated circuit device according to claim 19, wherein the first cluster is formed at a vertically higher level wiring layer than that of the first and second clusters, the second and third clusters of conductive lines correspond to same level layers.

21. A semiconductor integrated circuit device according to claim 10, wherein the first cluster of conductive lines corresponds to a different level wiring layer than that of the second and first clusters of conductive lines.

22. A semiconductor integrated circuit device according to claim 21, wherein the first cluster is formed at a vertically higher level wiring layer than that of the first and second clusters, the second and third clusters of conductive lines correspond to same level layers.

23. A semiconductor integrated circuit device according to claim 12,
wherein the first mode of the circuit is a normal mode and the second mode thereof is a test mode, and
wherein in the normal mode, in which the first and second switching transistor are turned on, the potentials of the n-type well and of the p-type well are determined based on the first voltage on the first conductive line and the second voltage on the second conductive line, respectively, and in the test mode, in which the first and second switching transistors are turned off, the potentials of the n-type well and of the p-type well are determined based on a third voltage on the third conductive line and a fourth voltage on the fourth conductive line, respectively, the third voltage being more positive than the first voltage and the fourth voltage being more negative than the second voltage.

24. A semiconductor integrated circuit device on a semiconductor substrate, comprising:
a first line supplying a first voltage on the substrate;
a second line supplying a second voltage, lower than the first voltage, on the substrate;
a third line on the substrate;
a fourth line on the substrate;
an n-type region at which a first p-channel MISFET is formed, the first p-channel MISFET having a source region coupled to the first line, a drain region and a gate, wherein the n-type region is coupled to the third line;
a p-type region at which a first n-channel MISFET is formed, the first n-channel MISFET having a source region coupled to the second line, a drain region coupled to the drain region of the first p-channel MISFET and a gate, wherein the p-type region is coupled to the fourth line;
a first switching MISFET formed in the n-type region and coupled between the first and third lines and being turned on when the circuit is in a first mode in which the potential of the n-type region is determined based on the first voltage on the first line, wherein the first switching MISFET is turned off when the circuit is in a second mode in which the potential of the n-type region is determined based on a third voltage, higher than the first voltage, on the third line; and
a second switching MISFET formed in the p-type region and coupled between the second and fourth lines and being turned on when the circuit is in the first mode in which the potential of the p-type region is determined based on the second voltage on the second line, wherein the second switching MISFET is turned off when the circuit is in the second mode in which the potential of the p-type region is determined based on a fourth voltage, lower than the second voltage, on the fourth line.

25. A semiconductor integrated circuit device according to claim 24,
wherein the first mode is a normal operation mode, and
wherein the second mode is a test mode.

26. A semiconductor integrated circuit device according to claim 24,
   wherein the third voltage and the fourth voltage are supplied from outside of the semiconductor integrated circuit.

27. A semiconductor integrated circuit device according to claim 24,
   wherein the first switching MISFET is of a p-channel type and has a source region coupled to the third line and a drain region coupled to the first line, and
   wherein the second switching MISFET is of an n-channel type and has a source region coupled to the fourth line and a drain region coupled to the second line.

28. A semiconductor integrated circuit device according to claim 27,
   wherein the source region of the first p-channel MISFET and the drain region of the first switching MISFET are one region, and
   wherein the source region of the first n-channel MISFET and the drain region of the second switching MISFET are one region.

29. A semiconductor integrated circuit device according to claim 24, further comprising:
   a control circuit coupled to gates of the first and second switching MISFETs and, responsive to a control signal, controlling switching operation of the first and second switching MISFETs so that the first and second switching MISFETs are mutually turned on and turned off in accordance with a signal level of the control signal.

30. A semiconductor integrated circuit device according to claim 24, further comprising:
   a second p-channel MISFET formed in the n-type region and having a source region coupled to the first line, a drain region and a gate; and
   a second n-channel MISFET formed in the p-type region and having a source region coupled to the second line, a drain region coupled to the drain region of the second P-channel MISFET and a gate,
      wherein the second n-channel MISFET and the second p-channel MISFET are provided in one logic gate, and
      wherein the first n-channel MISFET and the first p-channel MISFET are provided in another logic gate.

31. A semiconductor integrated circuit device having a normal mode and a test mode capability, on a semiconductor substrate, comprising:
   a first line to which a first voltage is supplied, the first line being formed over the substrate;
   a second line to which a second voltage, lower than the first voltage, is supplied, the second line being formed over the substrate;
   a third line over the substrate;
   a fourth line over the substrate;
   an n-type region formed in the substrate and coupled to the third line;
   a p-type region formed in the substrate and coupled to the fourth line; and
   a plurality of logic gates, each including:
      a p-channel MISFET formed in the n-type region and having a source region coupled to the first line, a drain region and a gate; and
      an n-channel MISFET formed in the p-type region having a source coupled to the second line, a drain region coupled to the drain region of the p-channel MISFET and a gate coupled to the gate of the n-channel MISFET,
   wherein the voltage on the third line is approximately the same voltage to the first voltage in the normal mode and the voltage on the third line is a voltage larger than the first voltage in the test mode, so that a threshold voltage of the p-channel MISFET in the test mode is larger than that of the p-channel MISFET in the normal mode, and
   wherein the voltage on the fourth line is approximately the same voltage to the second voltage in the normal mode and the voltage on the fourth line is a voltage smaller than the second voltage in the test mode, so that a threshold voltage of the n-channel MISFET in the test mode is larger than that of the n-channel MISFET in the normal mode.

32. A semiconductor integrated circuit device according to claim 31, further comprising:
   a p-channel switching MISFET formed in the n-type region and coupled between the first and third lines and being turned on when the circuit is in the normal mode, wherein the p-channel switching MISFET is turned off when the circuit is in the test mode; and
   an n-channel switching MISFET formed in the p-type region and coupled between the second and fourth lines and being turned on when the circuit is in the normal mode, wherein the n-channel switching MISFET is turned off when the circuit is in the test mode.

33. A semiconductor integrated circuit device according to claim 32,
   wherein the voltage on the third line and the voltage on the fourth line are supplied from outside of the semiconductor integrated circuit when the circuit is in the test mode.

34. A semiconductor integrated circuit device according to claim 31,
   wherein the p-channel switching MISFET has a source region coupled to the third line, a drain region coupled to the first line and a gate to which a first control signal is applied, and
   wherein the n-channel switching MISFET has a source region coupled to the fourth line, a drain region coupled to the second line and a gate to which a second control signal is applied.

35. A semiconductor integrated circuit device according to claim 34, further comprising:
   a control circuit coupled to the gates of the first and second switching MISFETs and controlling switching operations of the first and second switching MISFETs by providing the first and second signals in response to a control signal.

36. A semiconductor integrated circuit device over a semiconductor substrate, comprising:
   a first line supplying a first voltage over the substrate;
   a second line supplying a second voltage, lower than the first voltage, over the substrate;
   a third line over the substrate;
   a fourth line over the substrate,
      the semiconductor substrate having an n-type well coupled to the third line and a p-type well coupled to the fourth line;
   a p-channel MISFET formed in the n-type well region and having a source region coupled to the first line, a drain region and a gate;

a n-channel MISFET formed in the p-type well region and having a source region coupled to the second line, a drain region coupled to the drain of the p-channel MISFET and a gate coupled to the p-channel MISFET;

a p-channel switching MISFET formed in the n-type well region and coupled between the first and third lines and being turned on when the circuit is in a first mode in which the potential of the n-type well region is determined by the first voltage on the first line, wherein the p-channel switching MISFET is turned off when the circuit is in a second mode in which the potential of the n-type well region is determined by a third voltage, higher than the first voltage, on the third line, the third voltage being applied to the third line from outside of the semiconductor integrated circuit device in the second mode, and an n-channel switching MISFET formed in the p-type well region and coupled between the second and fourth lines and being turned on when the circuit is in the first mode in which the potential of the p-type well region is determined by the second voltage on the second line, wherein the n-channel switching MISFET is turned off when the circuit is in the second mode in which the potential of the p-type well region is determined by a fourth voltage, lower than the second voltage, on the fourth line, the fourth voltage being applied to the third line from outside of the semiconductor integrated circuit device in the second mode.

37. A semiconductor integrated circuit device according to claim 36, wherein the first switching MISFET has a source region coupled to the third line and a drain region coupled to the first line, and wherein the second switching MISFET has a source region coupled to the fourth line and a drain region coupled to the second line.

38. A semiconductor integrated circuit device according to claim 36, wherein the first mode is a normal operation mode, and wherein the second mode is a test mode.

39. A semiconductor integrated circuit device having, at a principal plane of a semiconductor substrate thereof, an arrangement comprising:

at least one group each including a series arrangement of plural cell regions, each cell region having a p-channel MISFET portion formed at an n-type region and an n-channel MISFET portion formed at a p-type region, the p-channel MISFET portions of the series arrangement forming one array of p-channel MISFET portions and the n-channel MISFET portions of the series arrangement forming another, adjoining array thereto of n-channel MISFET portions, the p-channel MISFET portion of each cell region adjoining the n-channel MISFET portion of that region and being operatively coupled thereto;

a first conductive line coupled to first power terminals to supply a first voltage to the p-channel MISFET portions;

a second conductive line coupled to second power terminals to supply a second voltage, lower than the first voltage, to the n-channel MISFET portions;

a third conductive line provided to supply selectively power to the n-type region of the plural cell regions;

a fourth conductive line provided to supply selectively power to the p-type region of the plural cell regions;

at least one switching set including a first switching transistor comprising a MISFET having a source-drain path coupled between the first and third conductive lines and a gate coupled to receive a control signal, and a second switching transistor comprising a MISFET having a source-drain path coupled between the second and fourth conductive lines and a gate coupled to receive a control signal, wherein the first and third conductive lines and the second and fourth conductive lines become short-circuited in a first mode of the circuit in which the first and second switching transistors are turned on, and in a second mode of the circuit the first and second switching transistors are turned off, respectively, wherein the first through the fourth conductive lines are arranged in a manner to enclose the group of cell regions, and wherein the first and second switching transistors are located at a part of the principal plane of the substrate where the first through the fourth conductive lines are extended over.

40. A semiconductor integrated circuit device according to claim 39, wherein the n-type region and the p-type region include a common n-type well for the array of p-channel MISFET portions and a common p-type well for the array of n-channel MISFET portions associated with each group of plural cell regions, respectively.

41. A semiconductor integrated circuit device according to claim 40, wherein the n-channel and p-channel MISFET portions of each cell region are rectangular shaped, a first of a pair of opposing transverse sides of the n-channel MISFET portion of each cell region adjoining a first of a pair of opposing transverse sides of the p-channel MISFET portions of that cell region, and a pair of opposing longitudinal sides of each of the n-channel and p-channel MISFET portions being for adjoining thereto other ones of the n-channel and p-channel MISFET portions of the group of plural cell regions, respectively.

42. A semiconductor integrated circuit device according to claim 41, wherein each p-channel MISFET portion includes at least one p-channel MISFET and each n-channel MISFET portion includes at least one n-channel MISFET coupled to said at least one p-channel MISFET, and wherein at least one of the plural cell regions includes a complementary MISFET logic circuit for performing an inverting logic operation.

43. A semiconductor integrated circuit device according to claim 42, wherein said at least one switching set includes a single said switching set provided for each group having a series arrangement of plural cell regions.

44. A semiconductor integrated circuit device according to claim 43, wherein the third conductive line is electrically connected at locations of the n-type well at each of the plural cell regions and the fourth conductive line is electrically connected at locations of the p-type well at each of the plural cell regions, and wherein the first switching transistor includes a p-channel MISFET, formed at the n-type well at a location thereof near an end of the series arrangement of the group of plural cell regions and beneath power-supply-voltage lines of the circuit, having a drain coupled to receive the first voltage, a source coupled to the n-type well and a gate coupled to a first control signal line, and the second switching transistor includes an n-channel MISFET, formed at the p-type well at a location thereof near the first switching transistor and beneath the power-supply-voltage lines of the circuit, having a drain coupled to receive the second voltage, a source coupled to the p-type well and a gate coupled to a second control signal line.

45. A semiconductor integrated circuit device according to claim 42, wherein said at least one switching circuit includes a respective said switching circuit provided at each of the plural cell regions of the group, the p-channel MISFET of the switching circuit at each cell region being formed at the n-type well near the second of the pair of transverse sides of the p-channel MISFET portion thereof, and the n-channel MISFET of the switching circuit at each cell region being formed at the p-type well near the second of the pair of transverse sides of the n-channel MISFET portion thereof.

46. A semiconductor integrated circuit device according to claim 40,
wherein the first mode of the circuit is a normal mode and the second mode thereof is a test mode, and
wherein in the normal mode, in which the first and second switching transistor are turned on, the potentials of the n-type well and of the p-type well are determined based on the first voltage on the first conductive line and the second voltage on the second conductive line, respectively, and in the test mode, in which the first and second switching transistors are turned off, the potentials of the n-type well and of the p-type well are determined based on a third voltage on the third conductive line and a fourth voltage on the fourth conductive line, respectively, the third voltage being more positive than the first voltage and the fourth voltage being more negative than the second voltage.

47. A semiconductor integrated circuit comprising:
at least one CMOS FET circuit each including a second-conductivity-type MOS FET in a first-conductivity-type well formed over a semiconductor substrate and a first-conductivity-type MOS FET in a second-conductivity-type well formed over the substrate;
a first power-supply-voltage line electrically connected to a first power terminal of the CMOS FET circuit;
a second power-supply-voltage line to which a voltage lower than that of the first power-supply-voltage line is applied is electrically connected to a second power terminal of the CMOS FET circuit;
a third power-supply-voltage line provided to supply selectively power to the first-conductivity-type well;
a fourth power-supply-voltage line provided to supply selectively power to the second-conductivity-type well
wherein the third power-supply-voltage line and the fourth power-supply-voltage line are provided independently of the first power-supply-voltage line and of the second power-supply-voltage line, respectively;
a first switching transistor comprising a MOS FET being electrically connected between the first power-supply-voltage line and the third power-supply-voltage line; and
a second switching transistor comprising a MOS FET being electrically connected between the second power-supply voltage line and the fourth power-supply-voltage line,
wherein the first and third power-supply-voltage lines become short-circuited through selectively actuating the first switching transistor, and the second and fourth power-supply-voltage lines become short-circuited through selectively actuating the second switching transistor,
wherein a set including the first and second switching transistors is commonly provided for all circuits included in said at least one CMOS FET circuit, each CMOS FET circuit has its own cell region, covering a plan view area including contiguous parts of the first and second-conductivity-type wells,
wherein each of the third power-supply-voltage line and the fourth power-supply-voltage line is formed of a separate conductor wiring, and
wherein a connective portion for connecting the conductor wiring for the third power-supply-voltage line with the first-conductivity-type well and another connective portion for connecting the conductor wiring for the fourth power-supply-voltage line with the second-conductivity-type well are provided for each cell region.

48. A semiconductor integrated circuit according to claim 47, wherein said at least one CMOS FET circuit includes a plurality of CMOS FET circuits each of which has its own said cell region, the plurality of cell regions associated with the plurality of CMOS FET circuits are arrayed in series such that the second-conductivity-type MOS FETs thereof cover different parts along the first-conductivity-type well and the first-conductivity-type MOS FETs thereof are provided respectively adjacent thereto covering different parts along the second-conductivity-type well.

49. A semiconductor integrated circuit according to claim 48,
wherein the first power-supply-voltage line is electrically connected to the source of at least one second-conductivity-type MOS FET in each CMOS FET circuit, the second power-supply-voltage line is electrically connected to the source of at least one second-conductivity-type MOS FET in each CMOS FET circuit, the drains of at least one first and of a second conductivity-type MOS FETs are mutually connected to an output terminal, and the gates of corresponding pairs of first and second conductivity-type MOS FETs are connected to a respective input terminal, and
wherein the MOS FET of the first switching transistor has the second conductivity type and is provided in the first-conductivity-type well, and the MOS FET of the second switching transistor has the first conductivity type and is provided in the second-conductivity-type well, the source-drain path of the first switching transistor MOS FET is connected between the first and third power-supply-voltage lines, the source-drain path of the second switching transistor MOS FET is connected between the second and fourth power-supply voltage lines, and the first and second switching transistor MOS FETs are set, in response to application of gate control signals thereat, in a conducting state when in a normal operation of the semiconductor integrated circuit and are set in a non-conducting state when in a testing operation of the same.

50. A semiconductor integrated circuit according to claim 49, wherein each of the plurality of cell regions is associated with a CMOS FET logic circuit for performing a single or multi-input inverting logic operation.

51. A semiconductor integrated circuit according to claim 50, wherein each CMOS FET logic circuit has equal numbers of first and second conductivity-type MOS FETs.

52. A semiconductor integrated circuit according to claim 48, wherein each of the plurality of cell regions is associated with a CMOS FET logic circuit for performing a single or multi-input inverting logic operation.

53. A semiconductor integrated circuit according to claim 52, wherein each CMOS FET logic circuit has equal numbers of first and second conductivity-type MOS FETs, the second-conductivity-type MOS FETs associated with all of the cell regions being commonly formed in the first-conductivity-type well, and the first-conductivity-type MOS FETs associated with all of the cell regions being commonly formed in the second-conductivity-type well.

* * * * *